(12) United States Patent
Toyota

(10) Patent No.: US 8,436,358 B2
(45) Date of Patent: May 7, 2013

(54) IMAGE DISPLAY DEVICE AND MANUFACTURING METHOD THEREOF

(75) Inventor: Yoshiaki Toyota, Koshigaya (JP)

(73) Assignees: Hitachi Displays, Ltd., Chiba (JP); Panasonic Liquid Crystal Display Co., Ltd., Hyogo (JP)

( * ) Notice: Subject to any disclaimer, the term of this patent is extended or adjusted under 35 U.S.C. 154(b) by 205 days.

(21) Appl. No.: 13/088,515

(22) Filed: Apr. 18, 2011

(65) Prior Publication Data

US 2011/0260168 A1 Oct. 27, 2011

(30) Foreign Application Priority Data

Apr. 22, 2010 (JP) ................. 2010-098486

(51) Int. Cl.
*H01L 29/04* (2006.01)
*H01L 29/10* (2006.01)
*H01L 31/036* (2006.01)
*H01L 21/84* (2006.01)

(52) U.S. Cl.
USPC .............. 257/59; 257/E29.291; 257/E29.294; 438/149; 438/151; 438/158; 438/159; 438/160

(58) Field of Classification Search ............... 257/297, 257/E29.28, E29.007, E29.291, E29.294; 438/149, 151, 158–160

See application file for complete search history.

(56) References Cited

U.S. PATENT DOCUMENTS

| | | | |
|---|---|---|---|
| 6,261,880 B1 * | 7/2001 | Wu ............................... | 438/159 |
| 6,501,094 B1 * | 12/2002 | Yamazaki et al. ............... | 257/57 |
| 6,747,288 B2 * | 6/2004 | Yamazaki et al. ............... | 257/57 |
| 7,812,344 B2 * | 10/2010 | Yan et al. ........................ | 257/40 |
| 2006/0008932 A1 * | 1/2006 | Oh et al. .......................... | 438/34 |
| 2006/0202202 A1 * | 9/2006 | Denda et al. ..................... | 257/59 |
| 2010/0127270 A1 * | 5/2010 | Yan et al. ......................... | 257/66 |

FOREIGN PATENT DOCUMENTS

JP 2004-193248 7/2004

* cited by examiner

*Primary Examiner* — Matthew W Such
*Assistant Examiner* — Jeremy Joy
(74) *Attorney, Agent, or Firm* — Antonelli, Terry, Stout & Kraus, LLP.

(57) ABSTRACT

Provided is an image display device including thin film transistors on a substrate, including: gate lines and drain lines intersecting the gate lines, each thin film transistor having, in a channel region, a laminate structure in which a gate electrode, a gate insulating film, and a semiconductor layer are laminated in the stated order from the substrate side; and a pair of removal regions in which parts of the gate insulating film are removed, which are formed on both sides of the gate electrode and formed in a channel width direction of the channel region, in which when W represents a width of the gate electrode in the channel width direction of the channel region, and R represents a width of the gate insulating film in the channel width direction, which is sandwiched between the pair of removal regions, $R \geq W$ is satisfied.

5 Claims, 18 Drawing Sheets

(a)   (b)

(a)   (b)   (c)

IMAGE DISPLAY DEVICE AND MANUFACTURING METHOD THEREOF

CROSS-REFERENCE TO RELATED APPLICATION

The present application claims priority from Japanese application JP 2010-098486 filed on Apr. 22, 2010, the content of which is hereby incorporated by reference into this application.

BACKGROUND OF THE INVENTION

1. Field of the Invention

The present invention relates to an image display device and a manufacturing method therefor. In particular, the present invention relates to an image display device in which an aperture ratio of a pixel may be improved and a manufacturing method therefor.

2. Description of the Related Art

A conventional liquid crystal display device includes a non-emissive type liquid crystal display panel and a backlight unit, which illuminates the liquid crystal display panel from a rear surface side thereof. In the liquid crystal display panel, thin film transistors are formed in respective pixels. In each of the pixels, which are formed in matrix in a display region, there are provided a storage capacitor for storing display data (video signal) for one frame period and a thin film transistor for controlling writing of the video signal to the storage capacitor. In the liquid crystal display panel formed as described above, a gate line is connected to a gate electrode of the thin film transistor, and a video signal line (drain line), to which the video signal is input, is connected to a drain electrode thereof. The video signal supplied from the drain line is read based on an on-signal from the gate line, and the video signal is stored in the storage capacitor.

However, in the conventional liquid crystal display device, it is known that, even when the thin film transistor is OFF, electric charges leak from the storage capacitor due to a backlight beam from the backlight unit. As a method of reducing influence on image display due to this leakage current, increasing the size of the storage capacitor is performed. Meanwhile, because there is a demand for high image quality and high definition in recent years, an area occupied for one pixel tends to be reduced. In accordance with this reduction in pixel area, the storage capacitance is reduced, and hence there is a demand for reduction in leakage current in the thin film transistor.

As a technology of reducing an off current, that is, a leakage current of the thin film transistor, for example, there is a technology described in Japanese Patent Application Laid-open No. 2004-193248. In this technology, a bottom gate type thin film transistor includes an interlayer insulating film between a gate electrode and a source/drain electrode. The interlayer insulating film has a groove formed therein in a channel region, and a polysilicon layer, which becomes a semiconductor layer, is formed in contact with a gate insulating film, the interlayer insulating film, a heavily doped semiconductor layer, and the source/drain electrode. In this technology, the semiconductor layer formed on the side surface portion of the interlayer insulating film plays a role as an offset, and hence, due to electric field relaxation at a drain end, the off current, that is, the leakage current is reduced.

In the technology described in Japanese Patent Application Laid-open No. 2004-193248, the semiconductor layer is formed so as to be located on the inside of the gate electrode, and the gate electrode blocks the backlight beam from directly entering the semiconductor layer. In this manner, it is possible to reduce a photoleakage current, which is a leakage current generated when the backlight beam is applied to the thin film transistor. However, when considering fluctuations in processing dimension of the gate electrode and the semiconductor layer, the gate electrode is required to be formed larger in width than the semiconductor layer. In this case, there is a fear of reduction in aperture ratio of a pixel.

In particular, in a liquid crystal display device mounted in a mobile terminal, there is a demand for high definition within a limited casing size, and hence the size of one pixel is reduced. Meanwhile, the size of the thin film transistor or the like within the pixel is limited by the processing accuracy and the drive ability thereof, and hence there is a demand for a thin film transistor having a smaller occupied area.

SUMMARY OF THE INVENTION

The present invention has been made in view of the above-mentioned problems, and therefore has an object to provide an image display device capable of reducing a photoleakage current of a thin film transistor and also improving an aperture ratio of a pixel.

(1) In order to solve the above-mentioned problems, there is provided an image display device including a plurality of thin film transistors on a substrate, including: a plurality of gate lines formed on the substrate; a plurality of drain lines intersecting the plurality of gate lines formed on the substrate, each of the plurality of thin film transistors being of a bottom gate type and having, in a channel region, a laminate structure in which a gate electrode, a gate insulating film, and a semiconductor layer are laminated in the stated order from the substrate side; and a pair of removal regions in which parts of the gate insulating film are removed, which are formed on both sides of the gate electrode and formed in a channel width direction of the channel region, in which when W represents a width of the gate electrode in the channel width direction of the channel region, and R represents a width of the gate insulating film in the channel width direction, which is sandwiched between the pair of removal regions, $R \geqq W$ is satisfied.

(2) In order to solve the above-mentioned problems, there is provided a manufacturing method for an image display device including a plurality of thin film transistors on a substrate, including: forming a gate line including a gate electrode on the substrate; forming a gate insulating film on the gate electrode; forming a non-single-crystalline silicon film on the gate insulating film; processing the gate insulating film to form a pair of opening portions in the gate insulating film, the pair of opening portions each having at least one side edge portion formed in parallel to an extending direction of the gate electrode, the side edge portions being disposed opposed to each other so as to sandwich the gate electrode in plan view, the pair of opening portions being disposed in a channel width direction of a channel region; and forming a drain electrode and a source electrode on the non-single-crystalline silicon film, and subjecting parts of the gate electrode exposed in the pair of opening portions to etching using the gate insulating film as a mask.

According to the present invention, the size of the gate electrode may be reduced while avoiding the semiconductor layer from extending off the gate electrode, and hence the photoleakage current of the thin film transistor may be reduced and also the aperture ratio of the pixel can be improved. Further, with the suppression of the photoleakage current and the improvement of the aperture ratio, a high contrast liquid crystal display device may be manufactured in low cost.

DETAILED DESCRIPTION OF THE INVENTION

Hereinafter, embodiments to which the present invention is applied are described with reference to the drawings. In the following description, the same components are denoted by the same reference symbols, and the overlapping description thereof is omitted.

[First Embodiment]
[Overall Structure]

Figure 1:
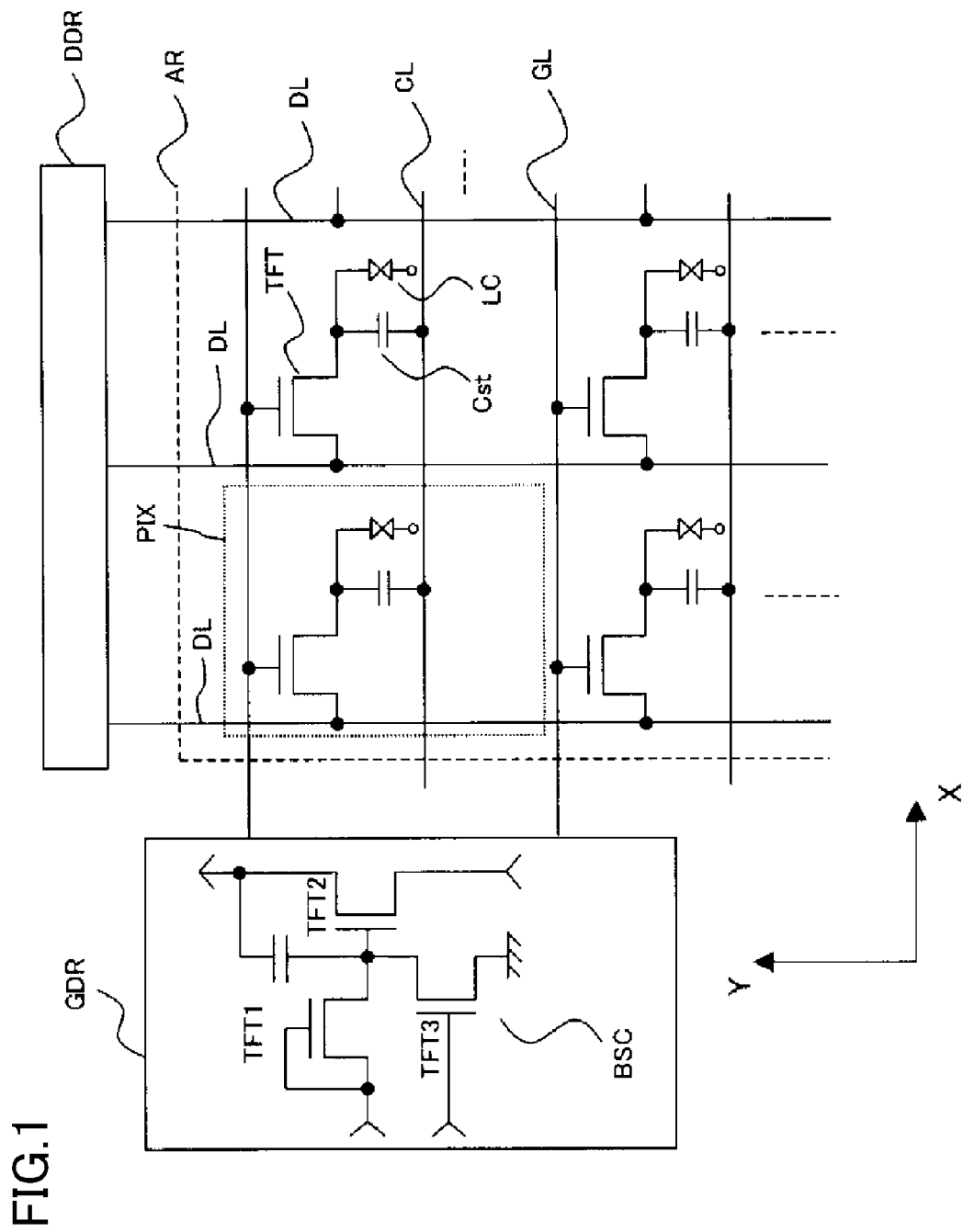
FIG. 1 is a diagram illustrating a schematic structure of a liquid crystal display device, which is an example of an image display device according to a first embodiment of the present invention.

FIG. 1 is a diagram illustrating a schematic structure of a liquid crystal display device, which is an example of an image display device according to a first embodiment of the present invention. Hereinafter, with reference to FIG. 1, an overall structure of the liquid crystal display device of the first embodiment is described. Note that, symbols X and Y illustrated in FIG. 1 represent an X-axis and a Y-axis, respectively. Further, in the following description, a video signal line formed within a display region, for supplying a video signal (drain signal) to each pixel is represented as a drain line, and a scan signal line for supplying a scan signal (gate signal) which controls ON/OFF of a thin film transistor in each pixel is represented as a gate line. Further, the following description is given assuming the case where the present invention is applied to a TN type liquid crystal display device, but the present invention is also applicable to liquid crystal display devices of a VA type, an IPS type, and the like.

The liquid crystal display device of the first embodiment includes a liquid crystal display panel. The liquid crystal display panel includes a first substrate formed of a transparent substrate, a second substrate formed of a transparent substrate, which has a color filter or a black matrix formed thereon and is provided opposed to the first substrate, and a liquid crystal layer (not shown) sandwiched between the first substrate and the second substrate. The liquid crystal display device is formed by combining the liquid crystal display panel and a backlight unit (backlight device) (not shown) which is a light source of the liquid crystal display panel. Further, fixing of the first substrate and the second substrate and sealing of liquid crystal are performed by using a sealing material, which is annularly applied at a peripheral portion of the second substrate. Further, the second substrate is smaller in size than the first substrate, and hence at least one side portion of the first substrate is exposed. At this side portion of the first substrate, there is formed a terminal portion to which an external signal is input, and a display signal from an external device is input thereto via, for example, a known flexible printed circuit board or the like. Further, in the liquid crystal display device of the first embodiment, within a region where the liquid crystal is sealed, a region where display pixels (hereinafter, abbreviated as pixels) PIX are formed is represented as a display region AR, which is indicated by the broken line illustrated in FIG. 1. Therefore, a region where the pixel PIX is not formed and which is unrelated to display is not included in the display region AR, even if the region is within the region where the liquid crystal is sealed. Note that, in the following description, even in the description of the liquid crystal display panel, the liquid crystal display panel is referred to as the liquid crystal display device.

Further, as for the first substrate and the second substrate, for example, a known glass substrate is generally used as a base. However, the substrate to be used is not limited to a glass substrate, and may be other insulating substrates such as a quartz glass and plastic (resin). For example, when a quartz glass is used, a process temperature may be increased, and hence an insulating film (gate insulating film) at a gate portion of a thin film transistor TFT, which is described later, may be densified. Therefore, reliability may be improved. Besides, when a plastic (resin) substrate is used, it is possible to provide a lightweight liquid crystal display device having excellent impact resistance.

In the liquid crystal display device of the first embodiment, as illustrated in FIG. 1, scan signal lines (gate lines) GL are formed on a surface of the first substrate on the liquid crystal side within the display region AR, the scan signal lines GL extending in the X direction and being arranged in parallel to each other in the Y direction. Further, video signal lines (drain lines) DL extending in the Y direction and being arranged in parallel to each other in the X direction are formed. A rectangular region surrounded by the drain lines DL and the gate lines GL form a region in which the pixel PIX is formed. Therefore, the respective pixels PIX are arranged in matrix within the display region AR. Each of the pixels PIX includes the thin film transistor TFT which is ON/OFF controlled by the scan signal from the gate line GL, a pixel electrode to which the video signal is supplied from the drain line DL via the thin film transistor TFT in the ON state, and a storage capacitor Cst for storing, for one frame period, electric charges supplied as the video signal to the pixel electrode. Further, each of the pixels PIX includes a common electrode which is formed on the second substrate, for supplying a common signal having a potential which becomes a reference with respect to a potential of the video signal.

An electric field is generated between the pixel electrode and the common electrode, that is, the first substrate and the second substrate, and molecules of the liquid crystal are driven by this electric field. Note that, the present invention is applicable to a liquid crystal display device of a so-called IPS type (including IPS-Pro type) or lateral electric-field type, in which the pixel electrode and the common electrode are formed on the first substrate, and an electric field having a parallel component to a main surface of the first substrate is generated, to thereby drive the molecules of the liquid crystal by the electric field. Such a liquid crystal display device is known as a liquid crystal display device capable of performing so-called wide viewing angle display. The display is performed in a normally black display mode, in which when an electric field is not applied to the liquid crystal, light transmittance is minimum (black display), and the light transmittance is increased by applying the electric field. Note that, the present invention is not limited to a liquid crystal display device of a TN type or an IPS type, and is also applicable to non-emissive type image display devices, such as a VA type liquid crystal display device, or self-emission type image display devices, such as an organic EL display device.

Further, in the liquid crystal display device of the first embodiment, a video signal drive circuit (drain driver) DDR is formed on the first substrate in an upper portion of FIG. 1, and a scan signal drive circuit (gate driver) GDR is formed on the first substrate on a left side of FIG. 1. Note that, in the following description, when it is unnecessary to particularly distinguish the drain driver DDR from the gate driver GDR, those are simply abbreviated as drive circuits (drivers).

Further, each of the drain lines DL and each of the gate lines GL are provided so that end portions thereof extend beyond the sealing material. The drain lines DL are respectively connected to output terminals of the drain driver DDR, and the gate lines GL are respectively connected to output terminals of the gate driver GDR. Further, inputs of the drain driver DDR and the gate driver GDR are connected to terminal portions (not shown) by wiring formed of, for example, a metal thin film, to thereby input display data.

Note that, in the liquid crystal display device of the first embodiment, the drain driver DDR and the gate driver GDR are formed on the first substrate, but the present invention is not limited thereto. For example, the drain driver and the gate driver may be formed as a semiconductor device formed of a semiconductor chip, and this semiconductor chip may be mounted on the first substrate. Alternatively, a semiconductor device formed by, for example, tape automated bonding or chip on film (COF) method may have a side connected to the first substrate.

[Pixel Structure]

Figure 2:
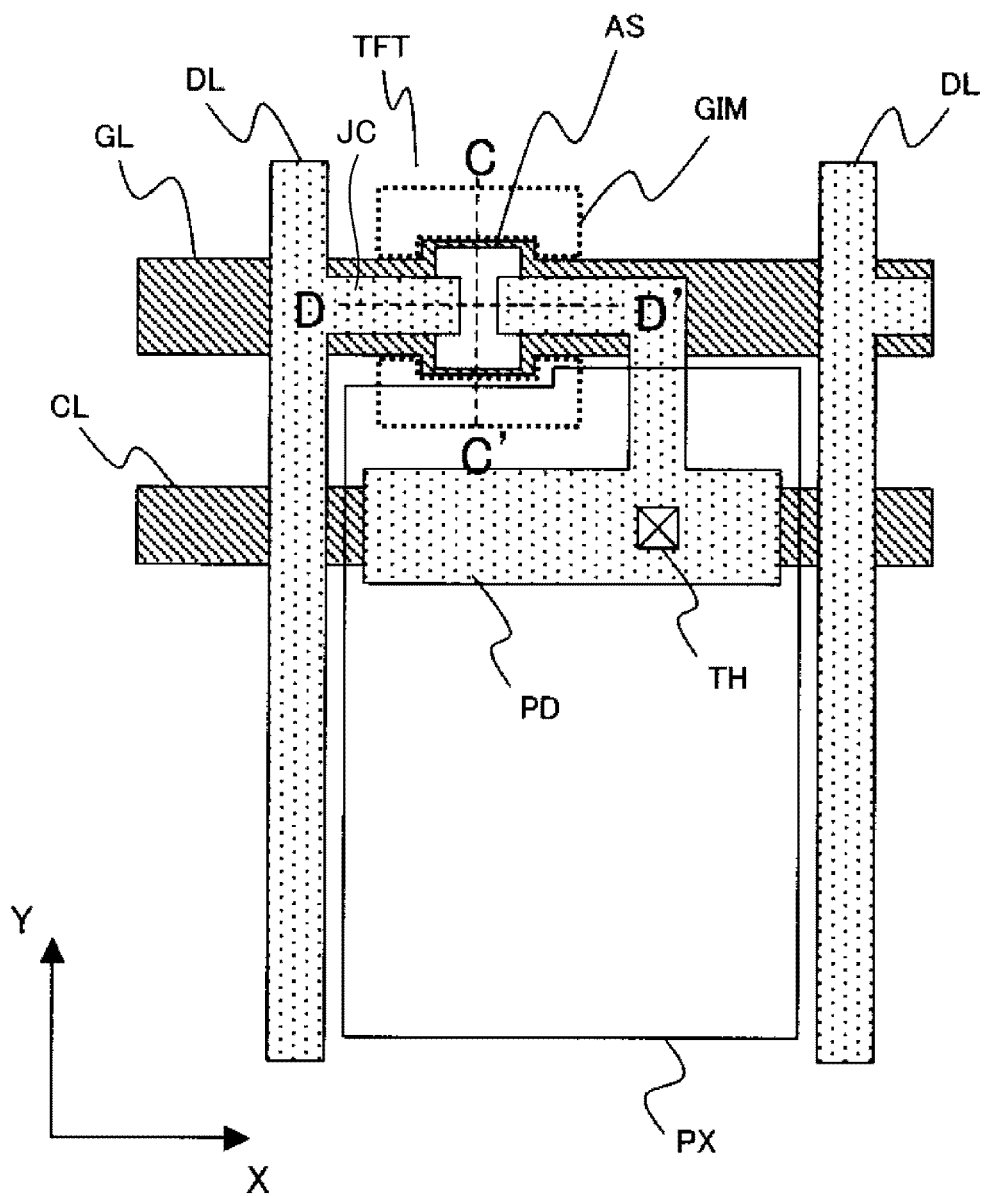
FIG. 2 is a plan view illustrating a pixel structure of the image display device according to the first embodiment of the present invention.

FIG. 2 is a plan view illustrating a pixel structure of the image display device according to the first embodiment of the present invention. Hereinafter, with reference to FIG. 2, details of the pixel structure of the first embodiment are described. Note that, for the sake of convenience, FIG. 2 only illustrates the first substrate, and description of a known alignment film or the like is omitted. Further, each thin film can be formed by a known photolithography technology, and hence detailed description of a formation method therefor is omitted.

As illustrated in FIG. 2, independent pixel electrodes PX are respectively formed in regions each surrounded by a pair of adjacent drain lines DL and a pair of adjacent gate lines GL within the display region AR, to thereby form a region for pixel. Note that, the pixel electrode PX is generally formed of a planar electrode made of a transparent conductive material, for example, indium-tin-oxide (ITO). With this structure, in the liquid crystal display device of the first embodiment, the pixels are formed in matrix. Further, in the liquid crystal display device of the first embodiment, a common line CL, which is formed in the same layer as the gate line GL, is formed parallel to the gate line GL.

Further, non-single-crystalline silicon is used for a semiconductor layer, and in this case, for example, a semiconductor layer AS made of amorphous silicon is formed so as to overlap a part of the gate line GL. This semiconductor layer AS is the semiconductor layer of the thin film transistor TFT. Note that, the non-single-crystalline silicon used to form the semiconductor layer AS is not limited to amorphous silicon, and may be, as described later, low-temperature polysilicon, microcrystalline silicon, or the like. Further, the drain line DL extending in the Y direction of FIG. 2 has a part corresponding to an extension portion (connection portion) JC, which extends to the thin film transistor TFT side. This extension portion JC is connected to a drain electrode DT of the thin film transistor TFT, which is formed on the semiconductor layer AS. Further, the drain line DL intersects the gate line GL and the common line CL through intermediation of the insulating film (gate insulating film) described later. Further, a source electrode ST, which is simultaneously formed with the formation of the drain line DL and the drain electrode DT, is formed so as to be opposed to the drain electrode DT on the semiconductor layer AS, the source electrode ST having an extension portion extending to the pixel region side from on the semiconductor layer AS. This extension portion extends to reach a pad portion PD, which is connected to the pixel electrode PX via a contact hole TH. Here, in the first embodiment, the pad portion PD and the common line CL, which are formed so as to overlap each other through intermediation of the insulating film, form the storage capacitor Cst.

Figure 30:
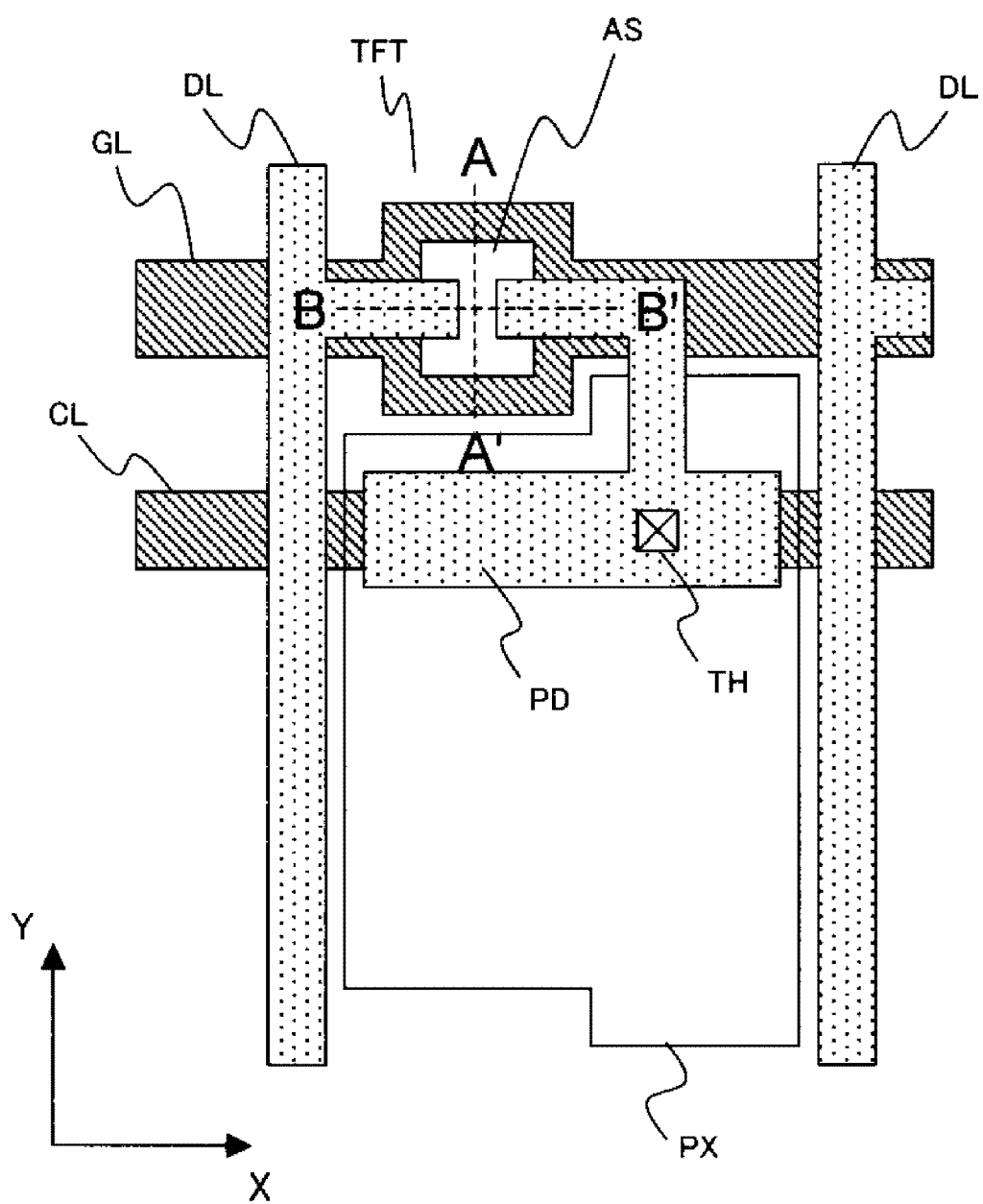
FIG. 30 is a plan view illustrating a schematic structure of a thin film transistor in a conventional image display device.

Further, in the thin film transistor TFT of the first embodiment, removal regions GIM of the insulating film are formed in regions indicated by the dotted lines, which are regions in which the insulating film to be formed between a gate electrode GT and the semiconductor layer AS is not formed. The removal regions GIM of the insulating film are formed so as to sandwich the semiconductor layer AS. That is, the removal regions GIM of the insulating film sandwich the gate line GL in the region where the semiconductor layer AS is formed from upper and lower sides of FIG. 2. In this case, the removal regions GIM of the first embodiment are formed so that, as described in detail later, the gate electrode is formed along, out of side edge portions of the removal regions GIM, side edge portions of the removal regions GIM on opposing sides, that is, sides on which the gate electrode is formed. With this structure, the protrusion amount of the gate electrode in the Y direction may be equivalent to the protrusion amount of the semiconductor layer AS. Further, an interval between the gate line GL and the common line CL which is disposed adjacent to the gate line GL, that is, an interval between the gate line GL and the pixel electrode of the pixel, and an interval between the gate line GL and a pixel electrode of an adjacent pixel in the Y direction may be formed smaller than those of the conventional thin film transistor illustrated in FIG. 30. Further, a distance between the gate line GL and the storage capacitor Cst may be formed smaller than in the conventional case. As a result, it is possible to increase the area to be occupied by the pixel electrode PX within the pixel region, which is a limited region surrounded by the drain lines DL and the gate lines GL. Therefore, it is possible to improve the aperture ratio while reducing the leakage current.

[Structure of Peripheral Circuit]

Figure 3:
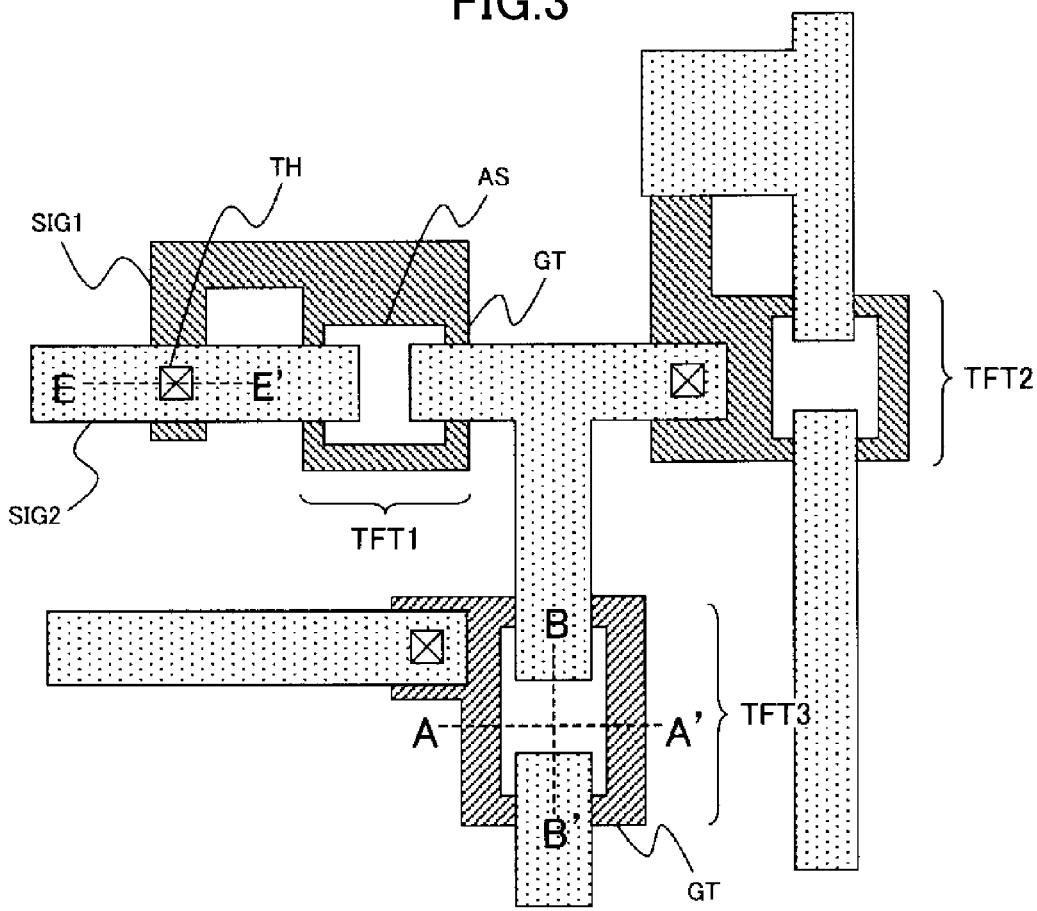
FIG. 3 is a plan view illustrating a schematic structure of a bootstrap circuit forming a peripheral circuit of the image display device according to the first embodiment of the present invention.

FIG. 3 is a plan view illustrating a schematic structure of a bootstrap circuit forming a peripheral circuit of the image display device according to the first embodiment of the present invention. Hereinafter, with reference to FIG. 3, the peripheral circuit of the first embodiment is described.

As illustrated in FIG. 3, a bootstrap circuit BSC of the first embodiment has a known circuit structure. A first thin film transistor TFT1 includes a gate electrode GT and a source electrode ST, which are electrically connected to each other via wiring SIG1 and a contact hole TH, and a first signal is input thereto. The first thin film transistor TFT1 includes a drain electrode DT, which is connected to a gate electrode GT of a second thin film transistor TFT2 and a source electrode ST of a third thin film transistor TFT3, via signal wiring SIG2. In this case, a second signal is input to a gate electrode GT of the third thin film transistor TFT3, and a ground potential is input to a drain electrode DT thereof. Further, the second thin film transistor TFT2 includes a source electrode ST connected to the high potential side and one end of a capacitor (not shown). The other end of the capacitor (not shown) is connected to the gate electrode GT of the second thin film transistor TFT2. Meanwhile, the second thin film transistor TFT2 includes a drain electrode DT connected to a reference potential. As described later, the thin film transistors TFT1 to TFT3, which form the bootstrap circuit BSC structured as described above, have the same structure as the conventional thin film transistor illustrated in FIG. 30.

[Structure of Thin Film Transistors]

Figure 4:
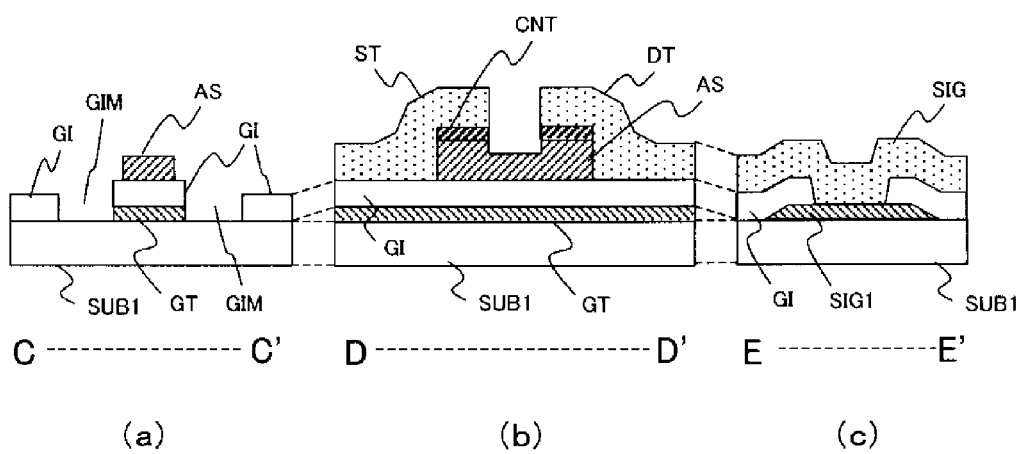
FIG. 4 is a view in which are arranged cross-sectional views taken along the line C-C' and the line D-D' of FIG. 2, and the line E-E' of FIG. 3.
Figure 5:
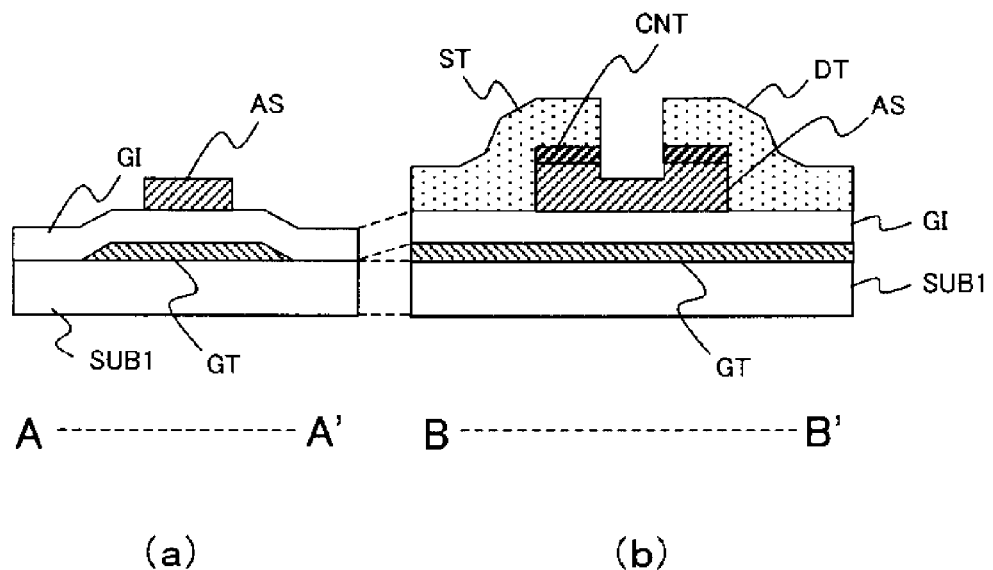
FIG. 5 is a view in which are arranged cross-sectional views taken along the line A-A' and the line B-B' of FIG. 3.

FIG. 4 is a view in which are arranged cross-sectional views taken along the line C-C' and the line D-D' of FIG. 2, and the line E-E' of FIG. 3. FIG. 5 is a view in which are arranged cross-sectional views taken along the line A-A' and the line B-B' of FIG. 3. Hereinafter, with reference to FIG. 4 and FIG. 5, the thin film transistor TFT formed in the pixel region and the thin film transistors TFT1 to TFT3 formed in the peripheral circuit region of the first embodiment are described in detail. Note that, FIG. 4(a) is a cross-sectional view taken along the line C-C' of FIG. 2, FIG. 4(b) is a cross-sectional view taken along the line D-D' of FIG. 2, FIG. 4(c) is a cross-sectional view taken along the line E-E' of FIG. 3, FIG. 5(a) is a cross-sectional view taken along the line A-A' of FIG. 3, and FIG. 5(b) is a cross-sectional view taken along the line B-B' of FIG. 3. Further, each of the thin film transistors TFT and TFT1 to TFT3 is a so-called inverted staggered transistor having a metal insulator semiconductor (MIS) structure, in which the gate line GL serves as the gate electrode. Further, although the transistor having the MIS structure drives in a manner that the drain electrode DT and the source electrode ST switch places depending on the bias application thereto, in this specification, for the sake of convenience, the electrode connected to the drain line DL is represented as the drain electrode DT, and the electrode connected to the pixel electrode PX is represented as the source electrode ST.

As illustrated in FIGS. 4(b) and 5(b), in each of the thin film transistors TFT and TFT1 to TFT3 in the liquid crystal display device of the first embodiment, an insulating film (not shown) is formed on the surface of a first substrate SUB1, which is an under layer for preventing incorporation of ions of, for example, sodium (Na) and potassium (K) into the thin film transistors TFT from the first substrate SUB1. Examples of the insulating film may include a thin film having a structure in which a layer made of silicon nitride (SiN) and the like and a layer made of silicon oxide (SiO) and the like are laminated in the stated order from the first substrate SUB1 side, but the insulating film is not limited thereto.

In an upper layer of this insulating film, the gate line GL is formed. In the liquid crystal display device of the first embodiment, a part of the gate line GL is used as the gate electrode GT. In an upper layer of the gate line GL including a region where the gate electrode GT is formed, an insulating film (gate insulating film) GI is formed so as to cover the gate line GL. In this case, in the region where each of the thin film transistors TFT and TFT1 to TFT3 is formed, the insulating film GI serves as a gate insulating film of each of the thin film transistors TFT and TFT1 to TFT3. On a part of the upper surface of the insulating film GI, where each of the thin film transistors TFT and TFT1 to TFT3 is formed, the semiconductor layer AS formed of an amorphous silicon thin film is formed at a portion where the semiconductor layer AS overlaps the gate line GL functioning as the gate electrode GT. The semiconductor layer AS has a recess portion (etching region) formed therein on the upper surface side of FIGS. 4(b) and 5(b).

On at least the upper surface of the semiconductor layer AS excluding the recess portion, contact layers CNT are formed. The contact layers CNT are, for example, heavily doped impurity layers (n$^+$ layers), in which high concentration n-type impurities are doped. The contact layer CNT provides an effect of decreasing a contact resistance between a channel region and the source electrode ST or the drain electrode DT. On the upper surfaces of the contact layers CNT in FIGS. 4(b) and 5(b), the drain electrode DT connected to the drain line DL and the source electrode ST connected to the pixel electrode PX are formed, the drain electrode DT and the source electrode ST being formed of conductive metal thin films made of aluminum and the like or an alloy thereof. The drain electrode DT and the source electrode ST are disposed so as to be opposed to each other while sandwiching the recess portion. On an entire surface of an upper layer of the thin film transistors TFT and TFT1 to TFT3, which is an upper surface of the first substrate SUB1 including upper layers of the drain electrode DT, the source electrode ST, and the semiconductor layer AS, a protective film (not shown) formed of, for example, a silicon nitride (SiN) film made of an inorganic material is formed so as to protect the thin film transistors. Note that, in this embodiment, the contact layers CNT are formed only on the upper surfaces of the semiconductor layer, but the present invention is not limited thereto. For example, the contact layers CNT may be formed on the upper surfaces and the side surfaces of the semiconductor layer.

In this case, as is apparent from FIGS. 4(a) and 5(a), in the thin film transistors of the first embodiment, the thin film transistor TFT for pixel, which is formed in the display region, and the thin film transistors TFT1 to TFT3 for peripheral circuit, which are formed in an outer region of the display region, are different in shape of the gate electrode GT in a gate width direction, which is orthogonal to a gate length direction which is a direction in which the drain electrode DL and the source electrode ST are opposed to each other. That is, in the gate electrode GT of the thin film transistor TFT for pixel, the removal regions GIM are formed, which are regions where parts of the gate line GL are removed together with the parts of the insulating film. GI so as to sandwich at least the gate line (including the gate electrode GT) GL, along the extending direction of the gate line GL forming the gate electrode GT. A region sandwiched by the pair of removal regions GIM includes a semiconductor region of the thin film transistor TFT. The width of the semiconductor layer AS in the right-and-left direction of FIG. 4(a), which is the width in the gate width direction of the semiconductor layer AS overlapping the gate line GL forming the gate electrode GT, is formed smaller than the width of the gate electrode GT and the width of the insulating film GI. That is, in the channel region of the thin film transistor TFT, when the gate electrode width in the channel width direction is W, the width of the insulating film (gate insulating film) GI in the channel width direction is R, and the width of the semiconductor layer AS in the channel width direction is H, R>H and W>H are satisfied. In this case, as described in detail later, because the gate electrode GT is subjected to etching using the insulating film (gate insulating film) GI as a mask, RW is also satisfied. Further, in the liquid crystal display device of the first embodiment, as illustrated in FIG. 5(a), the thin film transistors TFT1 to TFT3 for peripheral circuit have the same structure as a conventional thin film transistor.

Further, within the peripheral circuit in which the thin film transistors are formed, in a portion where the wiring SIG2 extending from the source electrode ST and the wiring SIG1 extending from the gate electrode GT are electrically connected to each other, as illustrated in FIG. 4(c), the contact hole TH is formed in the insulating film GI. In this region where the contact hole TH is formed, the wiring SIG2 is formed in an upper layer of the wiring SIG1, and hence the wiring SIG1 and the wiring SIG2 are electrically connected to each other.

As described above, in the thin film transistor TFT for pixel in the liquid crystal display device of the first embodiment, there are formed the removal regions GIM where parts of the insulating film GI and parts of the gate line GL are removed, in the insulating film GI, which is formed to be overlapped by the semiconductor layer AS, and the gate line GL. Therefore, the size of the gate electrode may be reduced while avoiding the semiconductor layer from extending off the gate electrode, thereby reducing the photoleakage current and also improving the aperture ratio. As a result, the contrast of the liquid crystal display device may be improved.

[Description of Manufacturing Method]

Figure 6:
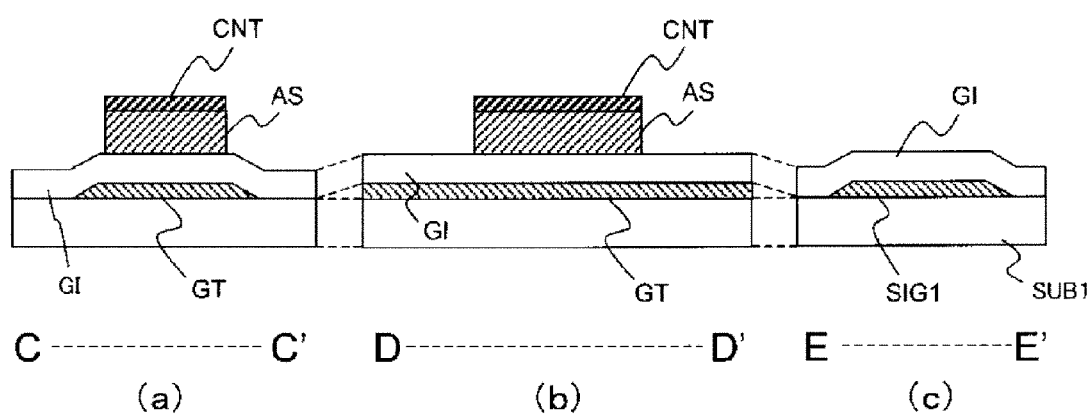
FIG. 6 is a view illustrating a manufacturing method for a thin film transistor for pixel and thin film transistors for peripheral circuit in the liquid crystal display device according to the first embodiment of the present invention by arranging cross-sectional views at the same positions as the cross-sectional views taken along the line C-C' and the line D-D' of FIG. 2, and the line E-E' of FIG. 3.
Figure 7:
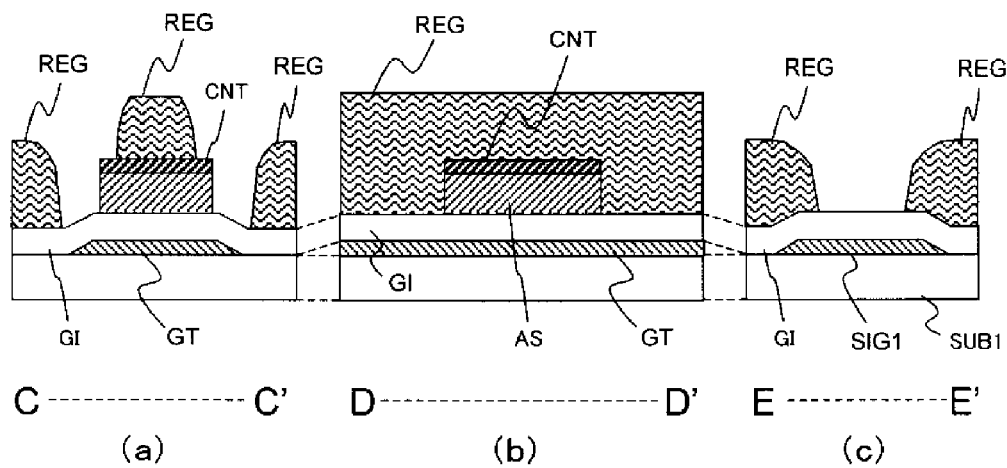
FIG. 7 is a view illustrating the manufacturing method for the thin film transistor for pixel and the thin film transistors for peripheral circuit in the liquid crystal display device according to the first embodiment of the present invention by arranging cross-sectional views at the same positions as the cross-sectional views taken along the line C-C' and the line D-D' of FIG. 2, and the line E-E' of FIG. 3.
Figure 8:
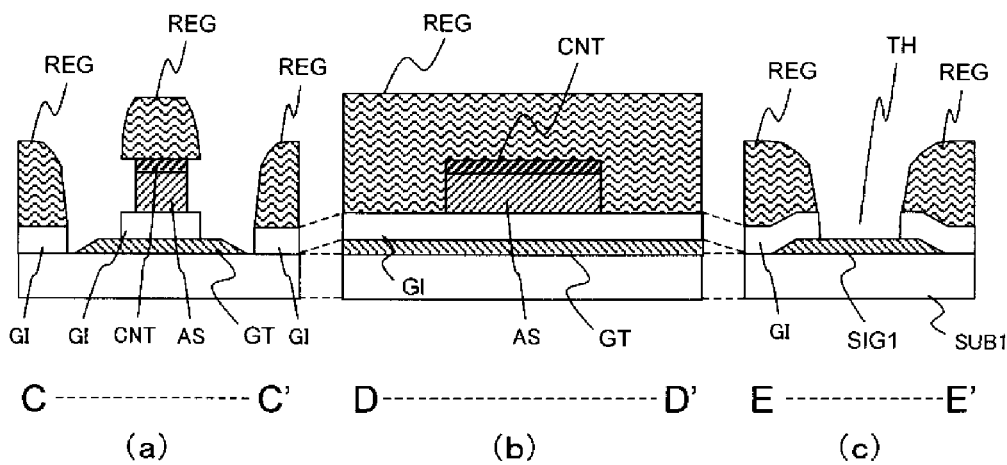
FIG. 8 is a view illustrating the manufacturing method for the thin film transistor for pixel and the thin film transistors for peripheral circuit in the liquid crystal display device according to the first embodiment of the present invention by arranging cross-sectional views at the same positions as the cross-sectional views taken along the line C-C' and the line D-D' of FIG. 2, and the line E-E' of FIG. 3.

FIGS. 6 to 8 are views illustrating a manufacturing method for the thin film transistor for pixel and the thin film transistors for peripheral circuit in the liquid crystal display device according to the first embodiment of the present invention.

Hereinafter, with reference to FIGS. 6 to 8, the manufacturing method for the thin film transistors of the first embodiment is described. Note that, similarly to FIG. 4 described above, FIGS. 6 to 8 illustrate cross-sectional views taken along the line C-C' and the line D-D' of FIG. 2, and the line E-E' of FIG. 3. Further, because steps other than steps related to formation of the removal regions are the same as those in the conventional manufacturing method for a liquid crystal display device, in the following description, the steps related to the formation of the removal regions are described in detail.

Step 1 (FIG. 6)

As illustrated in FIGS. 6, on the upper surface side (liquid crystal side) of the first substrate SUB1, the gate line GL including a portion for the gate electrode GT, the wiring SIG1 extending from the gate electrode GT, and the like are formed of aluminum (to have a thickness of, for example, 150 nm) by a known process. Next, by a known CVD process, as illustrated in FIG. 6, the insulating film (having a thickness of, for example, 300 nm) GI made of silicon nitride, an amorphous silicon layer (having a thickness of, for example, 200 nm) for the semiconductor layer AS, and a heavily doped amorphous silicon layer (having a thickness of, for example, 30 nm) for the contact layer CNT are formed in succession. Further, by a known photoetching process, a laminate of the heavily doped amorphous silicon layer and the amorphous silicon layer is processed into an island shape, to thereby form the semiconductor layer AS and the contact layer CNT. At this time, as illustrated in FIG. 6(c), in an upper layer of the wiring SIG1, only the insulating film GI is formed.

Step 2 (FIG. 7)

Next, after a resist is formed on the entire surface of the first substrate SUB1, as illustrated in FIG. 7(c), a resist pattern REG is formed for formation of a contact hole for electrically connecting a conductive layer (not shown), which is formed in the same layer as the gate electrode GT and the wiring SIG1 extending from the gate electrode GT, and a conductive layer (not shown), which is formed in the same layer as the source electrode ST and the wiring SIG2 extending from the source electrode ST, the conductive layers being formed through intermediation of the insulating film GI. The resist pattern at this time is obtained by pattering the resist so that, as illustrated in FIG. 7(b), the amorphous silicon layer is covered with the resist in the direction in which the drain electrode DT and the source electrode ST are opposed to each other, that is, in the D-D' direction. Further, as illustrated in FIG. 7(a), the resist is patterned so that, in the C-C' direction, the width of the resist is smaller than that of the amorphous silicon layer.

Step 3 (FIG. 8)

Next, as illustrated in FIG. 8, the contact layer CNT, which is the heavily doped amorphous silicon layer, and the semiconductor layer AS, which is the amorphous silicon layer, are subjected to etching using the resist pattern REG as a mask. At this time, first, isotropic etching is performed for processing the contact layer CNT and the semiconductor layer AS to reduce the width thereof with respect to the resist. That is, as illustrated in FIG. 8(a), the contact layer CNT and the semiconductor layer AS are reduced in width than the resist pattern REG in the gate width direction, which is the C-C' line direction. Next, as illustrated in FIG. 8(a), anisotropic etching is performed to remove the insulating film (gate insulating film) GI by etching using the resist pattern REG as a mask. When the insulating film GI is subjected to etching, as illustrated in FIG. 8(c), in the thin film transistor TFT1, the contact hole TH for electrically connecting the wiring SIG1 extending from the gate electrode GT and the wiring SIG2 extending from the source electrode ST is opened (formed). At this time, as illustrated in FIG. 8(b), in the D-D' line direction, because the contact layer CNT and the insulating film GI are covered with the resist REG, the etching processing is not performed.

Step 4 (FIG. 4)

Next, after the resist REG is removed, by a known source/drain electrode formation process, the source electrode ST and the drain electrode DT formed of aluminum thin films having a thickness of 500 nm are formed, and in the same layer, the source line SL, the drain line DL, and the like are formed. At this time, in the first embodiment, the gate electrode GT, the source electrode ST, and the drain electrode DT are formed of aluminum thin films made of the same material, and hence, in the C-C' cross section illustrated in FIG. 4(a), a part of the gate electrode GT is also removed by etching using the insulating film (gate insulating film) GI as a mask. After that, a part of the contact layer CNT is removed by etching using the source electrode ST and the drain electrode DT as a mask, and the recess portion is formed in the semiconductor layer AS, to thereby obtain the structure illustrated in FIG. 4. Note that, in each of the thin film transistors TFT1 to TFT3 forming the bootstrap circuit BSC illustrated in FIG. 3, the laminate formed of the contact layer CNT, which is formed of the heavily doped amorphous silicon layer, and the semiconductor layer AS, which is formed of the amorphous silicon layer, is processed in an island shape, and then the resist REG is formed so as to cover each of the thin film transistors TFT1 to TFT3, to thereby obtain the structure illustrated in FIG. 5. The formation process of the thin film transistors TFT1 to TFT3 is a known process.

As described above, the contact layer CNT and the semiconductor layer AS, which are formed of the amorphous silicon layer (including heavily doped amorphous silicon layer), and the insulating film GI of the present invention are processed using the same resist mask REG, and then the gate electrode GT is processed using the insulating film GI as a mask. Further, the contact layer CNT and the semiconductor layer AS are processed to reduce the width thereof to be smaller in width than the resist mask in the gate width direction of the thin film transistor TFT. As a result, the semiconductor layer AS can be located on the inside of the gate electrode GT in the gate width direction of the thin film transistor TFT, and the gate electrode GT can be reduced in size. Therefore, it is possible to support reduction of the photoleakage current due to light irradiation from the backlight and improvement of the aperture ratio of the pixel at the same time.

In this case, in the step of removing the insulating film (gate insulating film) GI, the contact hole TH for connecting the wiring SIG1 extending from the gate electrode GT and the wiring SIG2 extending from the source electrode ST is opened. Therefore, direct contact between the two wirings is possible without increasing the number of steps, and the peripheral circuit may be formed slim.

[Second Embodiment]

Figure 9:
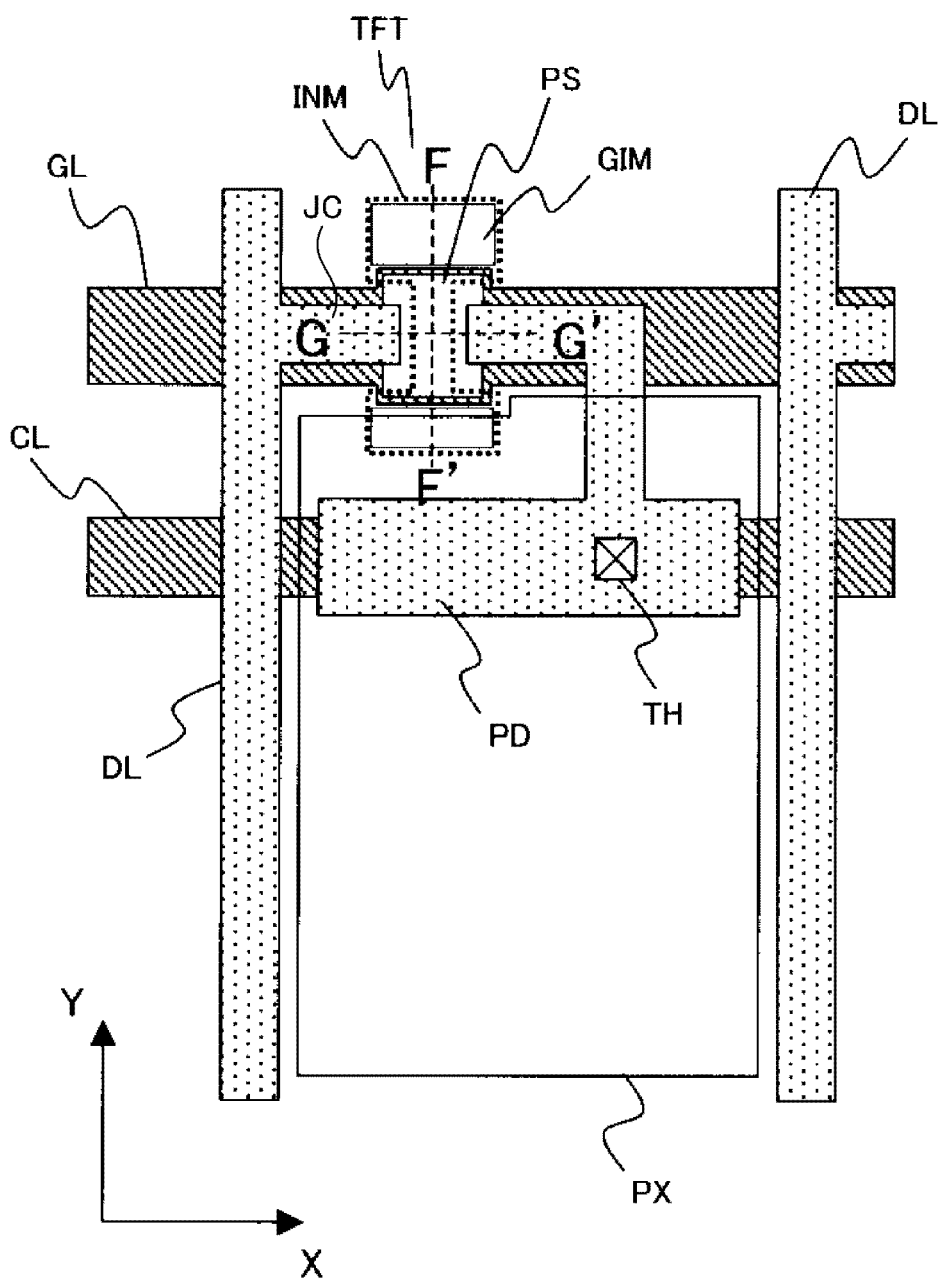
FIG. 9 is a plan view illustrating a pixel structure of an image display device according to a second embodiment of the present invention.
Figure 10:
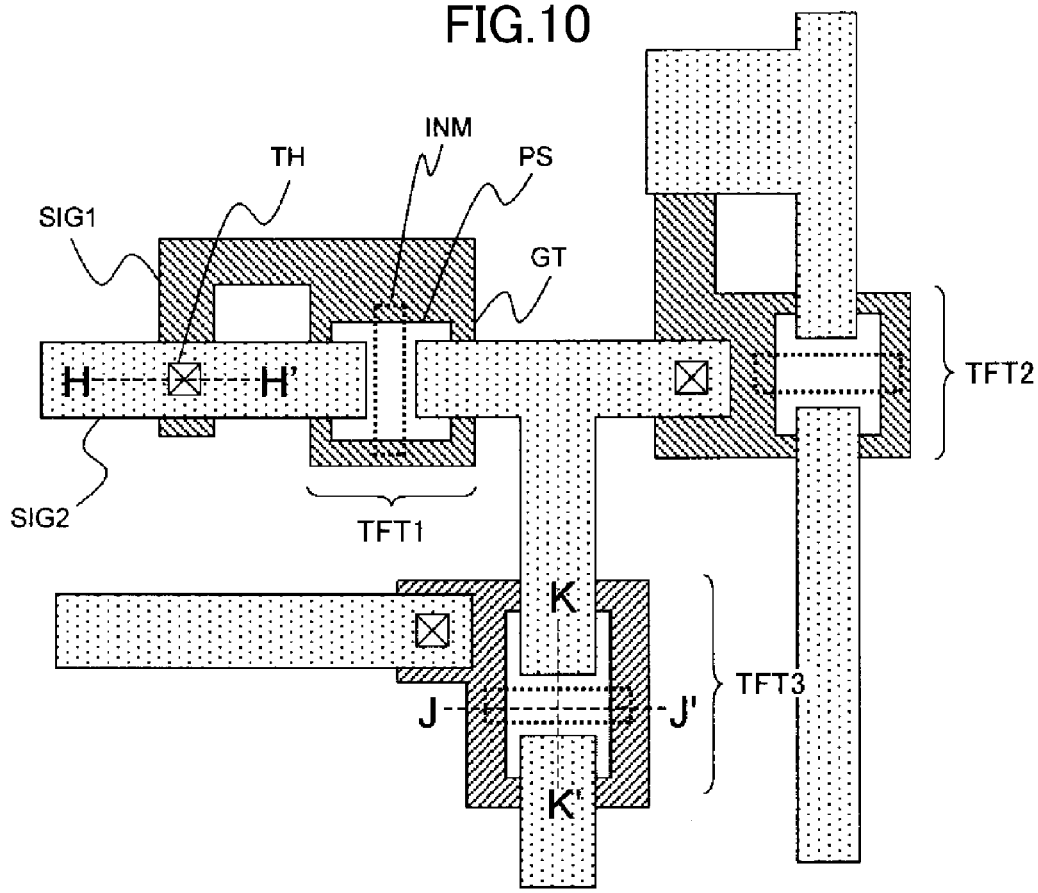
FIG. 10 is a plan view illustrating a schematic structure of a bootstrap circuit forming a peripheral circuit of the image display device according to the second embodiment of the present invention.

FIG. 9 is a plan view illustrating a pixel structure of an image display device according to a second embodiment of the present invention. FIG. 10 is a plan view illustrating a schematic structure of a bootstrap circuit forming a peripheral circuit of the image display device according to the second embodiment of the present invention. Hereinafter, with reference to FIGS. 9 and 10, a pixel and the peripheral circuit of the liquid crystal display device, which is the image display device of the second embodiment, are described. Note that, the liquid crystal display device of the second embodiment is different from that of the first embodiment only in the structure of the thin film transistor TFT, and other structures of the second embodiment are the same as those of the first embodiment. Therefore, in the following description, the structure of the thin film transistor TFT is described in detail. Further, the thin film transistor TFT of the second embodiment has a structure using a polysilicon layer as the semiconductor layer PS. Further, the thin film transistor TFT of the second embodiment is a coplanar type thin film transistor having the contact layers CNT formed on sides, that is, end portions of the semiconductor layer PS, which is a channel layer.

As illustrated in FIG. 9, also in the thin film transistor TFT disposed in a display region of the liquid crystal display device of the second embodiment, the semiconductor layer PS made of polysilicon is formed so as to overlap a part of the gate line GL. The semiconductor layer PS is the semiconductor layer (channel layer) of the thin film transistor TFT. Further, the drain line DL extending in the Y direction of FIG. 9 has a part corresponding to an extension portion (connection portion) JC which extends to the thin film transistor TFT side. This extension portion JC is connected to the drain electrode DT of the thin film transistor TFT, which is formed on the semiconductor layer PS. Further, the drain line DL intersects the gate line GL and the common line CL through intermediation of the insulating film (gate insulating film) and an interlayer insulating film, which are described later. Further, the source electrode ST, which is simultaneously formed with the formation of the drain line DL and the drain electrode DT, is formed so as to be opposed to the drain electrode DT through intermediation of the semiconductor layer PS, the source electrode ST having an extension portion extending to the pixel region side from the contact layer formed on the side surface of the semiconductor layer PS. This extension portion extends to reach the pad portion PD, which is connected to the pixel electrode PX via the contact hole TH. Here, also in the second embodiment, the pad portion PD and the common line CL, which are formed so as to overlap each other through intermediation of the insulating film (gate insulating film) and the interlayer insulating film, form the storage capacitor Cst.

Further, in the thin film transistor TFT of the second embodiment, the removal regions GIM of the insulating film are formed in regions indicated by the thin lines, which are regions in which the insulating film to be formed between the gate electrode GT and the semiconductor layer PS is not formed. Those removal regions GIM of the insulating film are formed so as to sandwich the semiconductor layer PS. That is, the removal regions GIM of the insulating film sandwich the gate line GL in the region where the semiconductor layer PS is formed from upper and lower sides of FIG. 9. Further, in the second embodiment, a removal region INM of the interlayer insulating film is formed in a region indicated by the dotted line, which is a region where the interlayer insulating film is not formed. Particularly in the thin film transistor TFT of the second embodiment, the removal region INM where a part of the interlayer insulating film is removed is formed in a region where the source electrode and the drain electrode are disposed opposed to each other and also in regions where the removal regions GIM of the insulating film are formed. Therefore, as is apparent from FIG. 9, in the thin film transistor TFT of the second embodiment, the region INM where a part of the interlayer insulating film is removed is formed while overlapping the regions GIM where parts of the insulating film (gate insulating film) are removed. In this case, the removal regions GIM of the second embodiment are also formed so that, as described in detail later, the gate electrode is formed along, out of side edge portions of the removal regions GIM, the side edge portions of the removal regions GIM on opposing sides, that is, sides on which the gate electrode is formed. With this structure, also in the thin film transistor TFT of the second embodiment, the protrusion amount of the gate electrode in the Y direction may be equivalent to the protrusion amount of the semiconductor layer PS. Further, an interval between the gate line GL and the common line CL which is disposed adjacent to the gate line GL, that is, an interval between the gate line GL and the pixel electrode of the pixel, and an interval between the gate line GL and a pixel electrode of an adjacent pixel in the Y direction may be formed smaller than those of the conventional thin film transistor illustrated in FIG. 30. Further, a distance between the gate line GL and the storage capacitor Cst may be formed smaller than in the conventional case. As a result, it is possible to increase the area to be occupied by the pixel electrode PX within the pixel region, which is a limited region surrounded by the drain lines DL and the gate lines GL. Therefore, it is possible to improve the aperture ratio while reducing the leakage current.

On the other hand, as illustrated in FIG. 10, each of the thin film transistors TFT1 to TFT3 of the bootstrap circuit BSC of the second embodiment also includes the semiconductor layer PS made of polysilicon. Also in the thin film transistors TFT1 to TFT3, the removal region INM where a part of the interlayer insulating film is removed is formed, and the source electrode and the drain electrode are disposed so as to be opposed to each other while sandwiching the removal region INM.

[Detailed Structure of Thin Film Transistors]

Figure 11:
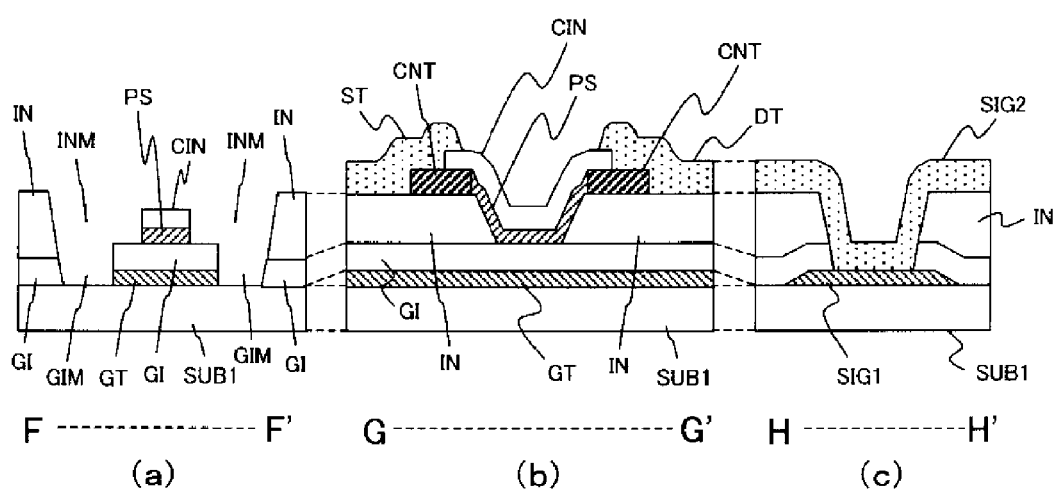
FIG. 11 is a view in which are arranged cross-sectional views taken along the line F-F' and the line G-G' of FIG. 9, and the line H-H' of FIG. 10.
Figure 12:
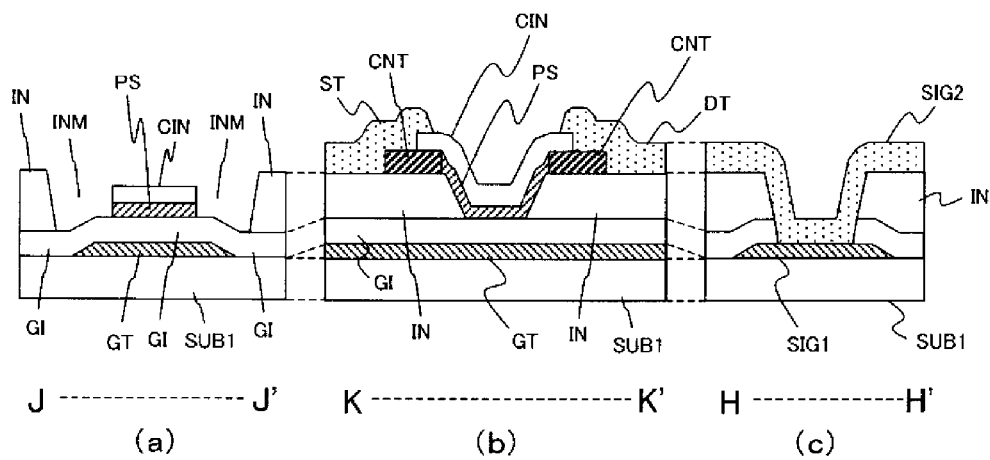
FIG. 12 is a view in which are arranged cross-sectional views taken along the line J-J', the line K-K', and the line H-H' of FIG. 10.

FIG. 11 are cross-sectional views taken along the line F-F' and the line G-G' of FIG. 9, and the line H-H' of FIG. 10. FIG. 12 are cross-sectional views taken along the line J-J', the line K-K', and the line H-H' of FIG. 10. Hereinafter, with reference to FIG. 11 and FIG. 12, the thin film transistor TFT formed in the pixel region and the thin film transistors TFT1 to TFT3 formed in the peripheral circuit region of the second embodiment are described in detail. Note that, FIG. 11(a) is a cross-sectional view taken along the line F-F' of FIG. 9, FIG. 11(b) is a cross-sectional view taken along the line G-G' of FIG. 9, FIG. 11(c) is a cross-sectional view taken along the line H-H' of FIG. 10, FIG. 12(a) is a cross-sectional view taken along the line J-J' of FIG. 10, FIG. 12(b) is a cross-sectional view taken along the line K-K' of FIG. 10, and FIG. 12(c) is a cross-sectional view taken along the line H-H' of FIG. 10.

As illustrated in FIGS. 11(b) and 12(b), also in each of the thin film transistors TFT and TFT1 to TFT3 of the second embodiment, the gate line GL is formed in an upper layer of the insulating film (under layer) (not shown) formed on the surface of the first substrate SUB1 on the liquid crystal side. A part of the gate line GL is used as the gate electrode GT. In an upper layer of the gate line GL including the region where the gate electrode GT is formed, the insulating film (gate insulating film) GI is formed so as to cover the gate line GL. Particularly in the thin film transistors TFT and TFT1 to TFT3 of the second embodiment, an interlayer insulating film IN is formed in an upper layer of the insulating film GI. Further, in each of the regions where the thin film transistors TFT and TFT1 to TFT3 are formed, a recess portion is formed so as to reach the insulating film GI extending in the channel width direction. In this case, the semiconductor layer PS is formed along from the side edge portion to the side wall portion and the bottom portion of the recess portion, and the contact layers CNT are formed at positions corresponding to the end portions of the semiconductor layer PS in an opposing manner on an upper surface of the interlayer insulating film IN. Further, on the upper surface of the semiconductor layer PS and the upper surfaces of the parts of the contact layers CNT, a cap insulating film CIN is formed, which is an insulating film made of silicon oxide. On upper surfaces in FIGS. 11(b) and 12(b) of the contact layers CNT, the drain electrode DT and the source electrode ST formed of conductive metal thin films are disposed so as to be opposed to each other, the drain electrode DT being connected to the drain line DL, the source electrode ST being connected to the pixel electrode PX. On an entire surface of an upper layer of the thin film transistors TFT and TFT1 to TFT3, which is an upper surface of the first substrate SUB1 including upper layers of the drain electrode DT, the source electrode ST, and the semiconductor layer PS, the protective film (not shown) formed of, for example, a silicon nitride (SiN) film made of an inorganic material is formed so as to protect the thin film transistors.

In this case, as is apparent from FIGS. 11(a) and 12(a), also in the thin film transistors of the second embodiment, the thin film transistor TFT for pixel, which is formed in the display region, and the thin film transistors TFT1 to TFT3 for peripheral circuit, which are formed in an outer region of the display region, are different in shape of the gate electrode GT in the gate width direction, which is orthogonal to the gate length direction which is a direction in which the drain electrode DL and the source electrode ST are opposed to each other. That is, in the gate electrode GT of the thin film transistor TFT for pixel, the removal regions GIM are formed, which are regions where parts of the gate line GL are removed together with the parts of the insulating film GI so as to sandwich at least the gate line (including the gate electrode GT) GL, along the extending direction of the gate line GL forming the gate electrode GT. Particularly in the second embodiment, the removal regions GIM are formed in the removal region INM where a part of the interlayer insulating film IN is removed. The region sandwiched by the pair of removal regions GIM includes a semiconductor region of the thin film transistor TFT. In this case, the width of the semiconductor layer PS in the right-and-left direction of FIG. 11(a), which is the width in the gate width direction of the semiconductor layer PS overlapping the gate line GL forming the gate electrode GT, is formed smaller than the width of the gate electrode GT and the width of the insulating film GI. Further, in the liquid crystal display device of the second embodiment, as illustrated in FIG. 12(a), the thin film transistors TFT1 to TFT3 for peripheral circuit have the same structure as a conventional thin film transistor.

Further, within the peripheral circuit in which the thin film transistors are formed, in a portion where the wiring SIG2 extending from the source electrode ST and the wiring SIG1 extending from the gate electrode GT are electrically connected to each other, as illustrated in FIGS. 11(c) and 12(c), the contact hole TH is formed in the insulating film GI and the interlayer insulating film IN. In this region where the contact hole TH is formed, the wiring SIG2 is formed in the upper layer of the wiring SIG1, and hence the wiring SIG1 and the wiring SIG2 are electrically connected to each other.

As described above, in the thin film transistor TFT for pixel in the liquid crystal display device of the second embodiment, there are formed the removal regions GIM where parts of the insulating film GI and parts of the gate line GL are removed, in the insulating film GI, which is formed to be overlapped by the semiconductor layer PS, the interlayer insulating film IN, and the gate line GL. Therefore, the size of the gate electrode may be reduced while avoiding the semiconductor layer from extending off the gate electrode, thereby reducing the photoleakage current and also improving the aperture ratio. As a result, the contrast of the liquid crystal display device may be improved.

[Description of Manufacturing Method]

Figure 19:
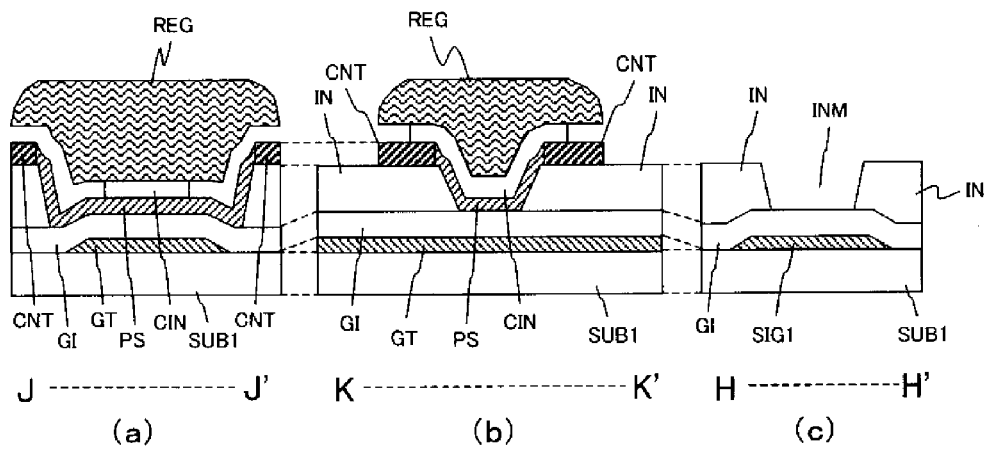
FIG. 19 is a view illustrating a manufacturing method for thin film transistors for peripheral circuit in the liquid crystal display device according to the second embodiment of the present invention by arranging cross-sectional views at the same positions as the cross-sectional views taken along the line J-J', the line K-K' and the line H-H' of FIG. 10.
Figure 20:
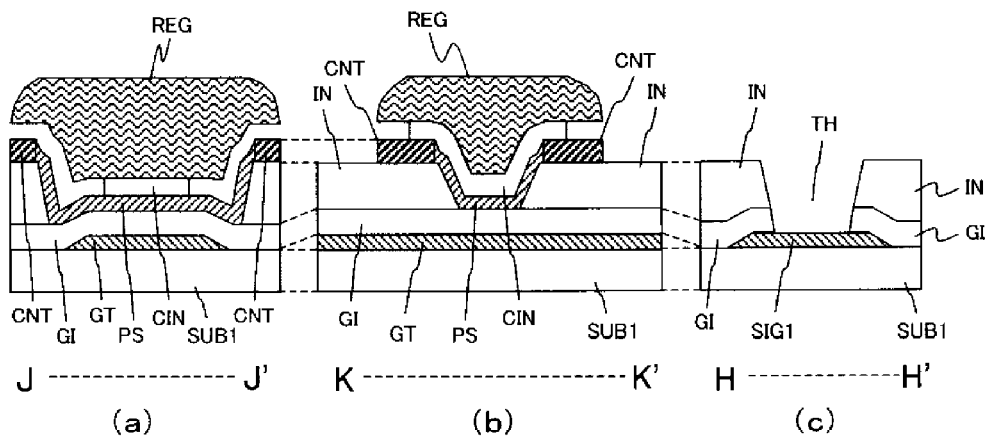
FIG. 20 is a view illustrating the manufacturing method for the thin film transistors for peripheral circuit in the liquid crystal display device according to the second embodiment of the present invention by arranging cross-sectional views at the same positions as the cross-sectional views taken along the line J-J', the line K-K' and the line H-H' of FIG. 10.
Figure 21:
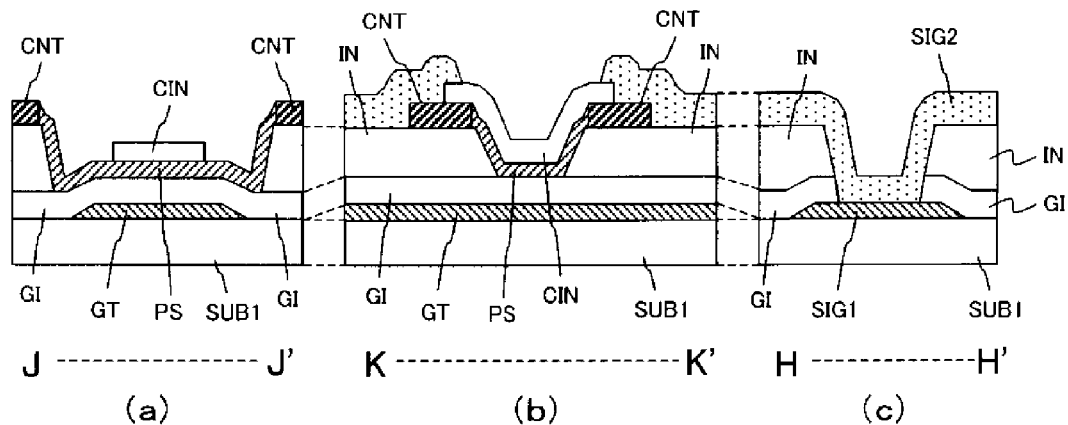
FIG. 21 is a view illustrating the manufacturing method for the thin film transistors for peripheral circuit in the liquid crystal display device according to the second embodiment of the present invention by arranging cross-sectional views at the same positions as the cross-sectional views taken along the line J-J', the line K-K' and the line H-H' of FIG. 10.

FIGS. 13 to 18 are views illustrating a manufacturing method for the thin film transistor for pixel in the liquid crystal display device according to the second embodiment of the present invention. FIGS. 19 to 21 are views illustrating a manufacturing method for the thin film transistors for peripheral circuit in the liquid crystal display device according to the second embodiment of the present invention. Hereinafter, with reference to FIGS. 13 to 21, the manufacturing method for the thin film transistors of the second embodiment is described. Note that, similarly to FIG. 11 and FIG. 12 described above, FIGS. 13 to 21 illustrate cross-sectional views taken along the line F-F' and the line G-G' of FIG. 9, and the line H-H', the line J-J', and the line K-K' of FIG. 10. Further, because steps other than steps related to formation of the removal regions INM and GIM are the same as those in the conventional manufacturing method for a liquid crystal display device, in the following description, the steps related to the formation of the removal regions INM and GIM are described in detail.

First, with reference to FIGS. 13 to 18, the manufacturing method for the thin film transistor for pixel of the second embodiment is described.

Figure 13:
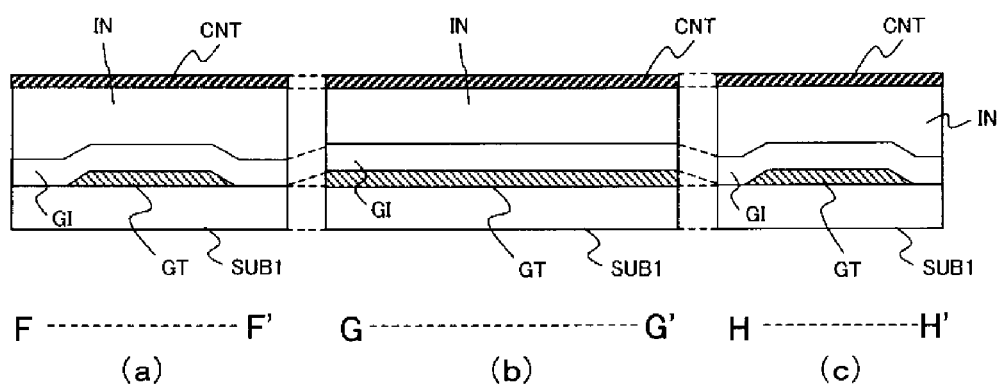
FIG. 13 is a view illustrating a manufacturing method for a thin film transistor for pixel in the liquid crystal display device according to the second embodiment of the present invention by arranging cross-sectional views at the same positions as the cross-sectional views taken along the line F-F' and the line G-G' of FIG. 9, and the line H-H' of FIG. 10.

Step 1-1 (FIG. 13)

First, as illustrated in FIG. 13, on a glass substrate corresponding to the first substrate SUB1, the gate line GL and the wiring in the same layer made of aluminum (having a thickness of, for example, 150 nm) are formed by a known process. Next, by a known CVD process, the insulating film (gate insulating film) GI made of silicon oxide having a thickness of, for example, 100 nm, the interlayer insulating film IN made of silicon nitride having a thickness of, for example, 500 nm, and the heavily doped amorphous silicon layer having a thickness of, for example, 30 nm (which later becomes the contact layer CNT) are formed in succession.

Figure 14:
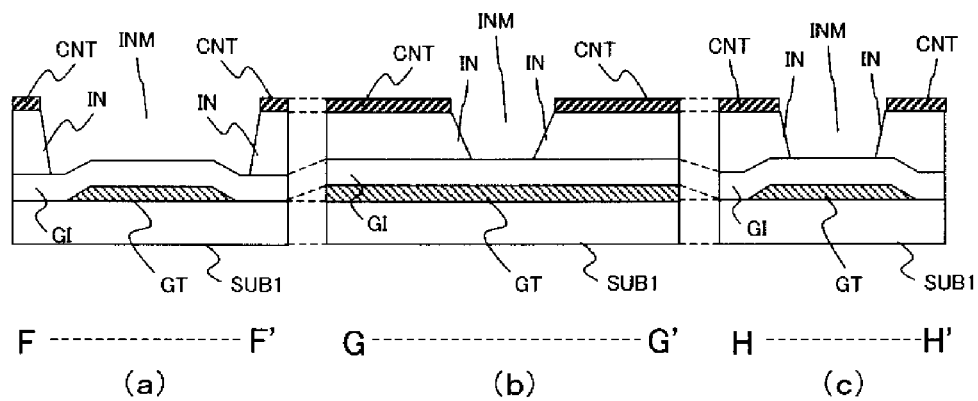
FIG. 14 is a view illustrating the manufacturing method for the thin film transistor for pixel in the liquid crystal display device according to the second embodiment of the present invention by arranging cross-sectional views at the same positions as the cross-sectional views taken along the line F-F' and the line G-G' of FIG. 9, and the line H-H' of FIG. 10.

Step 1-2 (FIG. 14)

Next, as illustrated in FIG. 14, by a known photo-dry etching process, the heavily doped amorphous silicon layer CNT and the interlayer insulating film IN are processed into a tapered shape, and a recess portion is formed in the interlayer insulating film IN so as to reach the insulating film (gate insulating film) GI. At this time, an etching rate is different between the insulating film (gate insulating film) GI made of silicon oxide and the interlayer insulating film IN made of silicon nitride, and hence the interlayer insulating film IN may be processed while leaving the insulating film (gate insulating film) GI unetched. With this step, as illustrated in FIG. 14(a), the removal region INM of the interlayer insulating film IN is formed so as to reach the insulating film GI while passing through from the heavily doped amorphous silicon layer CNT to the interlayer insulating film IN.

Figure 15:
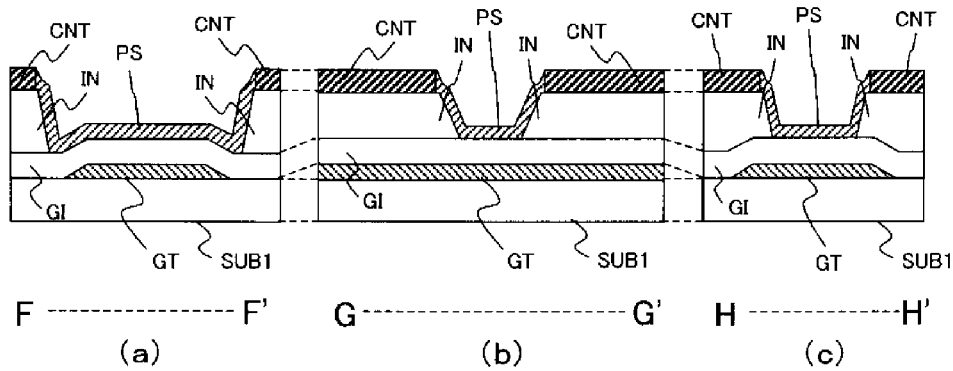
FIG. 15 is a view illustrating the manufacturing method for the thin film transistor for pixel in the liquid crystal display device according to the second embodiment of the present invention by arranging cross-sectional views at the same positions as the cross-sectional views taken along the line F-F' and the line G-G' of FIG. 9, and the line H-H' of FIG. 10.

Step 1-3 (FIG. 15)

Next, as illustrated in FIG. 15, by a known CVD process, an amorphous silicon layer having a thickness of, for example, 50 nm is formed in the recess portion. Then, the amorphous silicon layer is crystallized by a known laser annealing method. In this manner, the polysilicon layer PS for the semiconductor layer, and the heavily doped polysilicon layer CNT with low resistance for the contact layer are formed.

Figure 16:
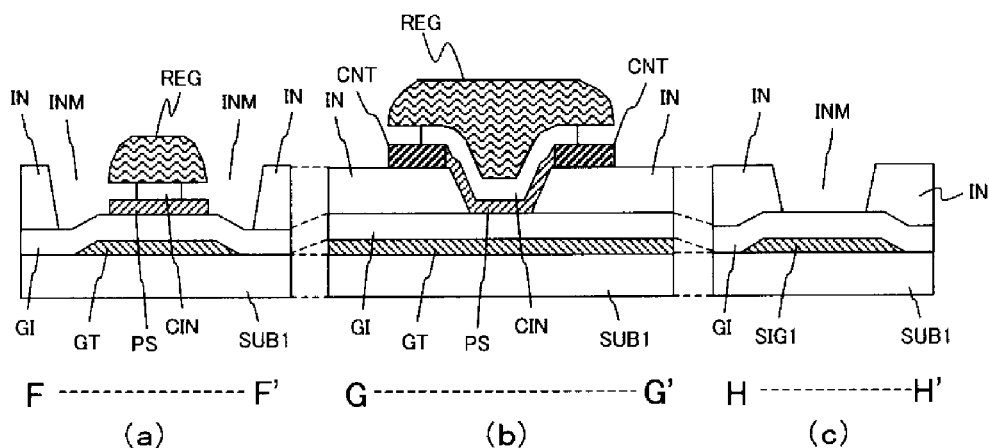
FIG. 16 is a view illustrating the manufacturing method for the thin film transistor for pixel in the liquid crystal display device according to the second embodiment of the present invention by arranging cross-sectional views at the same positions as the cross-sectional views taken along the line F-F' and the line G-G' of FIG. 9, and the line H-H' of FIG. 10.

Step 1-4 (FIG. 16)

Next, as illustrated in FIG. 16, the cap insulating film CIN made of silicon oxide is formed by a known CVD process. After the resist REG is patterned by a known photolithography process, the cap insulating film CIN and the polysilicon layer PS are processed into an island shape by a known etching process, to thereby form the semiconductor region of the thin film transistor TFT. At this time, the cap insulating film CIN is subjected to side etching, and is processed so that the surface of the polysilicon layer PS in the F-F' cross section of FIG. 16(a) and the surface of the heavily doped polysilicon layer CNT in the G-G' cross section of FIG. 16(b) are exposed.

Figure 17:
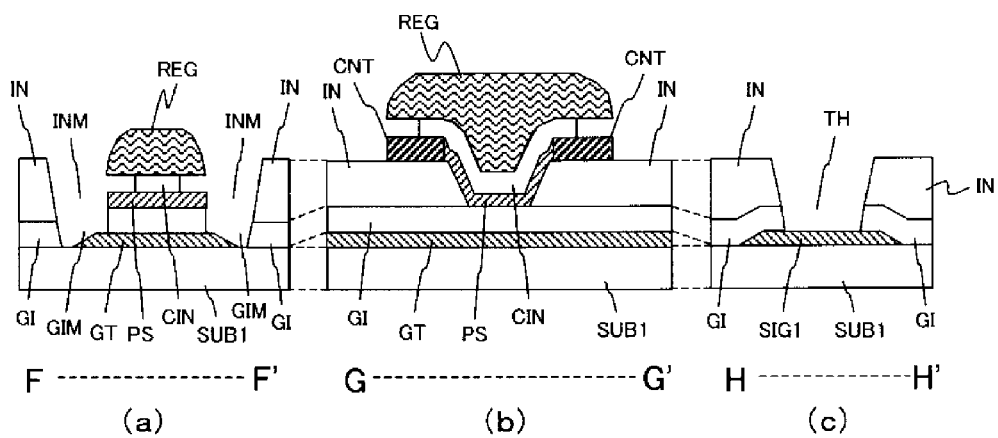
FIG. 17 is a view illustrating the manufacturing method for the thin film transistor for pixel in the liquid crystal display device according to the second embodiment of the present invention by arranging cross-sectional views at the same positions as the cross-sectional views taken along the line F-F' and the line G-G' of FIG. 9, and the line H-H' of FIG. 10.

Step 1-5 (FIG. 17)

Next, as illustrated in FIG. 17, parts of the insulating film (gate insulating film) GI are removed by etching as illustrated in the F-F' cross section of FIG. 17(a) using the resist REG and the interlayer insulating film IN as a mask. At this time, as illustrated in the H-H' cross section of FIG. 17(c), the contact hole TH for electrically connecting the wiring SIG1 extending from the gate electrode GT and the wiring SIG2 extending from the source electrode ST is opened in the insulating film (gate insulating film) GI.

Figure 18:
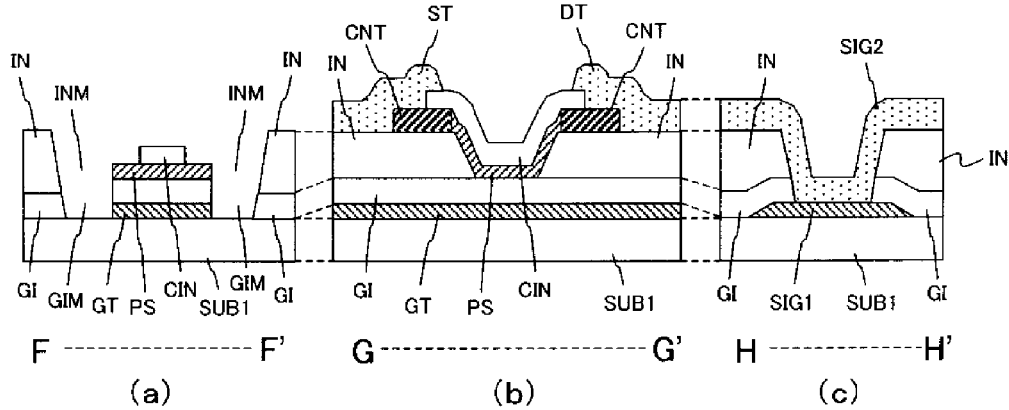
FIG. 18 is a view illustrating the manufacturing method for the thin film transistor for pixel in the liquid crystal display device according to the second embodiment of the present invention by arranging cross-sectional views at the same positions as the cross-sectional views taken along the line F-F' and the line G-G' of FIG. 9, and the line H-H' of FIG. 10.

Step 1-6 (FIG. 18)

Next, as illustrated in FIG. 18, after the resist is removed, by a known process, there are formed the source electrode ST and the drain electrode DT each made of aluminum and having a thickness of, for example, 500 nm, and wirings (including the source line SL and the drain line DL) extending from the source electrode ST and the drain electrode DT. At this time, the gate electrode GT, the source electrode ST, and the drain electrode DT are formed of the same material, and hence, as illustrated in the F-F' cross section of FIG. 18(a), a part of the gate electrode GT is removed by etching using the insulating film (gate insulating film) GI as a mask. After that, parts of the polysilicon layer PS and the heavily doped polysilicon layer CNT are removed by etching using the source electrode ST, the drain electrode DT, and the cap insulating film CIN as a mask, to thereby obtain the structure of the thin film transistor TFT illustrated in FIG. 11.

Next, with reference to FIGS. 19 to 21, the manufacturing method for the thin film transistors TFT1 to TFT3 for peripheral circuit of the second embodiment is described. Note that, the thin film transistors TFT1 to TFT3 for peripheral circuit described below are formed at the same time as the thin film transistor TFT for pixel described above. Further, the manufacturing method for the thin film transistors TFT1 to TFT3 for peripheral circuit has the same formation process as that of the thin film transistor TFT for pixel until the formation of the polysilicon layer PS, and hence description thereof is made with reference to FIGS. 13 to 15 as appropriate.

Step 2-1 (FIG. 13)

First, similarly to Step 1-1 of the thin film transistor TFT for pixel, on the glass substrate corresponding to the first substrate SUB1, the gate electrode GT made of aluminum having a thickness of, for example, 150 nm is formed by a known process. Next, by a known CVD process, the insulating film (gate insulating film) GI made of silicon oxide having a thickness of, for example, 100 nm, the interlayer insulating film IN made of silicon nitride having a thickness of, for example, 500 nm, and the heavily doped amorphous silicon layer having a thickness of, for example, 30 nm are formed in succession.

Step 2-2 (FIGS. 14 to 15)

Further, similarly to Step 1-2 of the thin film transistor TFT for pixel, the heavily doped amorphous silicon layer CNT and the interlayer insulating film IN are processed into a tapered shape, and a recess portion is formed. After that, the amorphous silicon layer having a thickness of, for example, 50 nm is formed in the recess portion, and then the amorphous silicon layer is crystallized by a laser annealing method. In this manner, the polysilicon layer PS and the heavily doped polysilicon layer CNT with low resistance are formed.

Step 2-3 (FIG. 19)

Next, as illustrated in FIG. 19, the cap insulating film CIN made of silicon oxide is formed by a known CVD process. Next, after the resist REG is patterned by a known photolithography process, as illustrated in FIG. 19, the cap insulating film CIN and the polysilicon layer PS are processed into an island shape by a known etching process. At this time, as illustrated in the J-J' cross section of FIG. 19(a), the resist mask REG is formed so as to cover the removal region INM of the interlayer insulating film IN. Further, the cap insulating film CIN is subjected to side etching, and as illustrated in the J-J' cross section of FIG. 19(a), the cap insulating film CIN is processed so that the cap insulating film CIN is located on the inside of the removal region INM of the interlayer insulating film IN, that is, formed smaller than the removal region INM.

Step 2-4 (FIG. 20)

Next, as illustrated in FIG. 20, a part of the insulating film (gate insulating film) GI is removed by etching using the resist REG and the interlayer insulating film IN as a mask. In this manner, as illustrated in the H-H' cross section of FIG. 20(c), the contact hole TH for electrically connecting the wiring SIG1 extending from the gate electrode GT and the wiring SIG2 extending from the source electrode ST is opened.

Step 2-5 (FIG. 21)

Next, as illustrated in FIG. 21, after the resist REG is removed, by a known process, the source electrode ST and the drain electrode DT of aluminum having a thickness of, for example, 500 nm, and wirings in the same layer are formed. At this time, as illustrated in the J-J' cross section of FIG. 21(a), the insulating film (gate insulating film) GI is not removed by etching, and hence the gate electrode GT of the thin film transistor TFT3 is not removed. After that, parts of the polysilicon layer PS and the heavily doped polysilicon layer CNT are removed by etching using the cap insulating film CIN, the source electrode ST, and the drain electrode DT as a mask. In this manner, there may be obtained the structure of the thin film transistors TFT1 to TFT3 for peripheral circuit of the second embodiment as illustrated in FIG. 12.

As described above, also in the thin film transistor of the second embodiment, similarly to the first embodiment, the polysilicon layer PS and the insulating film (gate insulating film) GI are processed using the same resist mask, and then the gate electrode GT is processed using the insulating film (gate insulating film) GI as a mask. Therefore, the semiconductor layer PS may be located on the inside of the gate electrode GT onto which the polysilicon layer PS, which is the semiconductor layer, overlaps, and further the size of the gate electrode GT may be reduced. Therefore, it is possible to support reduction of the photoleakage current due to light irradiation from the backlight and improvement of the aperture ratio of the pixel at the same time.

Further, in the second embodiment, by forming the channel by the semiconductor layer PS made of polysilicon, it is possible to improve the performance of the thin film transistors TFT and TFT1 to TFT3. Further, the interlayer insulating film IN exists between the gate line GL and the drain line DL, and hence it is possible to reduce the parasitic capacitance between the wirings, and to improve the withstand voltage of the thin film transistors TFT and TFT1 to TFT3. Therefore, it is possible to achieve special effects such as high-speed driving and improvement in yield in the liquid crystal display device.

Note that, in the second embodiment, as for the insulating film (gate insulating film) GI, instead of the silicon oxide film, a laminate film of a silicon oxide film and a silicon nitride film may be used. In particular, when the silicon nitride film is used as the insulating film (gate insulating film) GI, it is possible to effectively prevent the impurities in the first substrate SUB1 from diffusing and penetrating into the insulating film (gate insulating film) GI. Therefore, it is possible to achieve a special effect that characteristic fluctuations of the thin film transistor TFT may be suppressed.

Further, in the second embodiment, the method for crystallization of the amorphous silicon may be a solid phase growth method performed by thermal annealing, or a combination of the thermal annealing and the laser annealing. Further, a polysilicon layer may be directly formed by PECVD or reactive thermal CVD. By employing the method of directly forming the polysilicon layer by PECVD or reactive thermal CVD, it is possible to simplify the manufacturing steps and enhance the throughput. Further, the semiconductor layer PS may be made of microcrystalline silicon having a grain diameter of about 20 nm to 100 nm, or may be made of a compound of silicon and germanium. By using the compound of silicon and germanium, the performance of the thin film transistor TFT may be improved.

[Third Embodiment]

Figure 22:
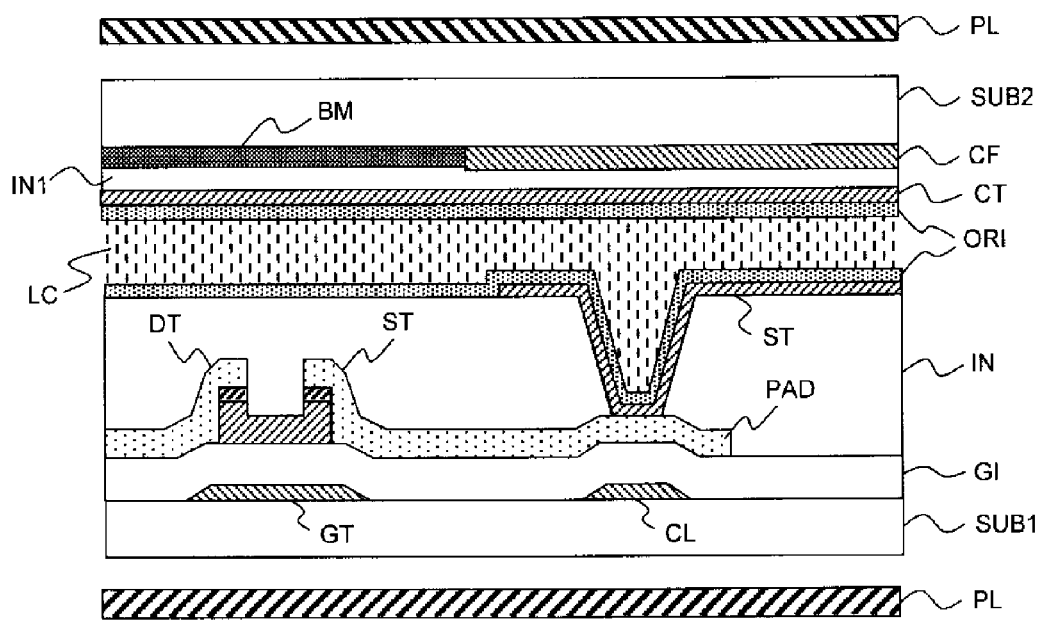
FIG. 22 is a cross-sectional view of a liquid crystal display device, which is an image display device according to a third embodiment of the present invention.

FIG. 22 is a cross-sectional view of a liquid crystal display device according to a third embodiment of the present invention, and particularly illustrates a TN type liquid crystal display device using the first substrate on which the thin film transistors of the first embodiment are formed. However, the present invention is not limited to the TN type liquid crystal display device, and is also applicable to a VA type liquid crystal display device, in which the pixel electrode and the common electrode are formed on different substrates similarly to the TN type liquid crystal display device, or an IPS type liquid crystal display device. Note that, structures other than the structure of the thin film transistor TFT formed within the display region of the first substrate SUB1 are the same as those of the conventional liquid crystal display device.

As illustrated in FIG. 22, the liquid crystal display device of the third embodiment includes a glass substrate (second substrate) SUB2, on which a black matrix BM, a color filter CF, an insulating film (overcoat layer) IN1, a common electrode CT, and an alignment film ORI are formed, and the glass substrate (first substrate) SUB1 of the first embodiment. The liquid crystal display device of the third embodiment has a structure in which the glass substrate SUB1 and the glass substrate SUB2 sandwich liquid crystal LC. Polarization plates PL are formed on both sides of the two glass substrates SUB1 and SUB2.

Also in the liquid crystal display device of the third embodiment, the black matrix BM is formed between the color filters CF formed at positions corresponding to the pixels. The black matrix BM blocks light which leaks from the formation region of the drain line or the like. With this structure, when a signal voltage transmitted from the drain line DL is applied between the pixel electrode PX and the common electrode CT, the alignment state of the liquid crystal changes depending on the voltage. In this manner, light from the backlight is controlled to display an image. Note that, the thin film transistor of the second embodiment may be used as the thin film transistor for pixel.

As illustrated in FIG. 22, by using the thin film transistor for pixel to which the present invention is applied, it is possible to reduce an interval between a semiconductor region and a storage capacitor region, in which the contact hole is formed, and hence the aperture ratio may be improved.

[Fourth Embodiment]

Figure 23:
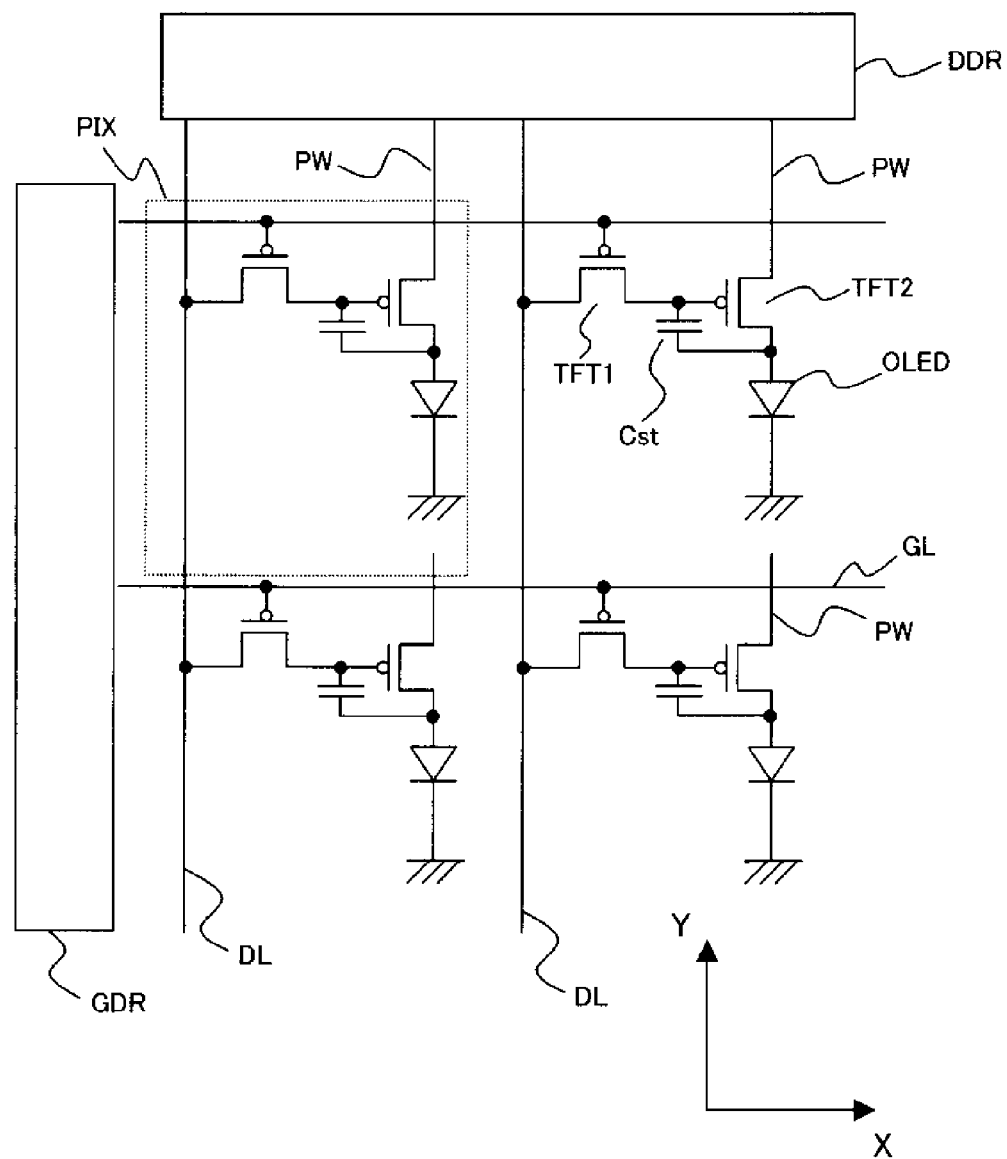
FIG. 23 is a diagram illustrating a schematic structure of a liquid crystal display device using an organic light emitting diode, which is an image display device according to a fourth embodiment of the present invention.

FIG. 23 is a diagram illustrating a schematic structure of an image display device using an organic light emitting diode, which is an image display device according to a fourth embodiment of the present invention. Hereinafter, with reference to FIG. 23, the image display device of the fourth embodiment is described. Note that, the image display device using the organic light emitting diode (OLED) of the fourth embodiment (hereinafter, abbreviated as OLED image display device) is of a bottom emission type, and structures other than the structure of the thin film transistor are the same as those of the conventional case. Therefore, in the following description, the structure of the thin film transistor is described in detail.

The image display device of the fourth embodiment is an organic EL display device including a first substrate, on which an organic EL film, a thin film transistor for driving the organic EL film, and the like are formed, and a sealing glass disposed so as to be opposed to the first substrate. The first substrate and the sealing glass are fixed by an encapsulation sealing material, and a space between the first substrate and the sealing glass is maintained in vacuum. On the surface of the first substrate opposed to the sealing glass, as illustrated in FIG. 23, the drain lines DL for supplying the video signal are formed, the drain lines DL extending in the Y direction and being arranged in parallel to each other in the X direction. Further, the gate lines GL for supplying the scan signal are formed, the gate lines GL extending in the X direction and being arranged in parallel to each other in the Y direction. A region surrounded by the drain lines DL and the gate lines GL form a region for pixel. In the respective regions for pixel (hereinafter, referred to as pixels) PIX, organic EL films (OLED layers) OLED which emit light of red (R), green (G), and blue (B) are formed. The respective pixels are arranged in matrix in the X direction and the Y direction of FIG. 23. A region where the pixels are formed is a pixel region (display region). Further, there are provided power supply lines PW which are formed adjacent to the drain lines DL, for supplying drive currents to the organic EL films.

Further, on the first substrate, there are formed the video signal drive circuit (drain driver) DDR for supplying the video signal (drain signal) to the drain lines DL, and the scan signal drive circuit (gate driver) GDR for supplying the scan signal (gate signal) to the gate lines GL. Outputs of the drain driver DDR and outputs of the gate driver GDR are respectively connected to the drain lines DL and the gate lines GL, which extend outside the pixel region beyond the encapsulation sealing material. Further, the drain driver DDR of the fourth embodiment includes a power supply for supplying power to the power supply lines PW, and outputs of the drain driver DDR are connected to the power supply lines PW, which extend outside the pixel region beyond the encapsulation sealing material.

Further, as illustrated in FIG. 23, each of the pixels PIX of the OLED display device of the fourth embodiment includes a light emission layer OLED including the organic EL film, a second thin film transistor TFT2 for controlling a current supplied to the light emission layer OLED, that is, a light emission amount of the light emission layer (OLED), a storage capacitor Cst connected in parallel between drain-gate terminals of the second thin film transistor TFT2, and a first thin film transistor TFT1 for writing a video signal of at least one frame to the storage capacitor Cst.

[Pixel Structure]

Figure 24:
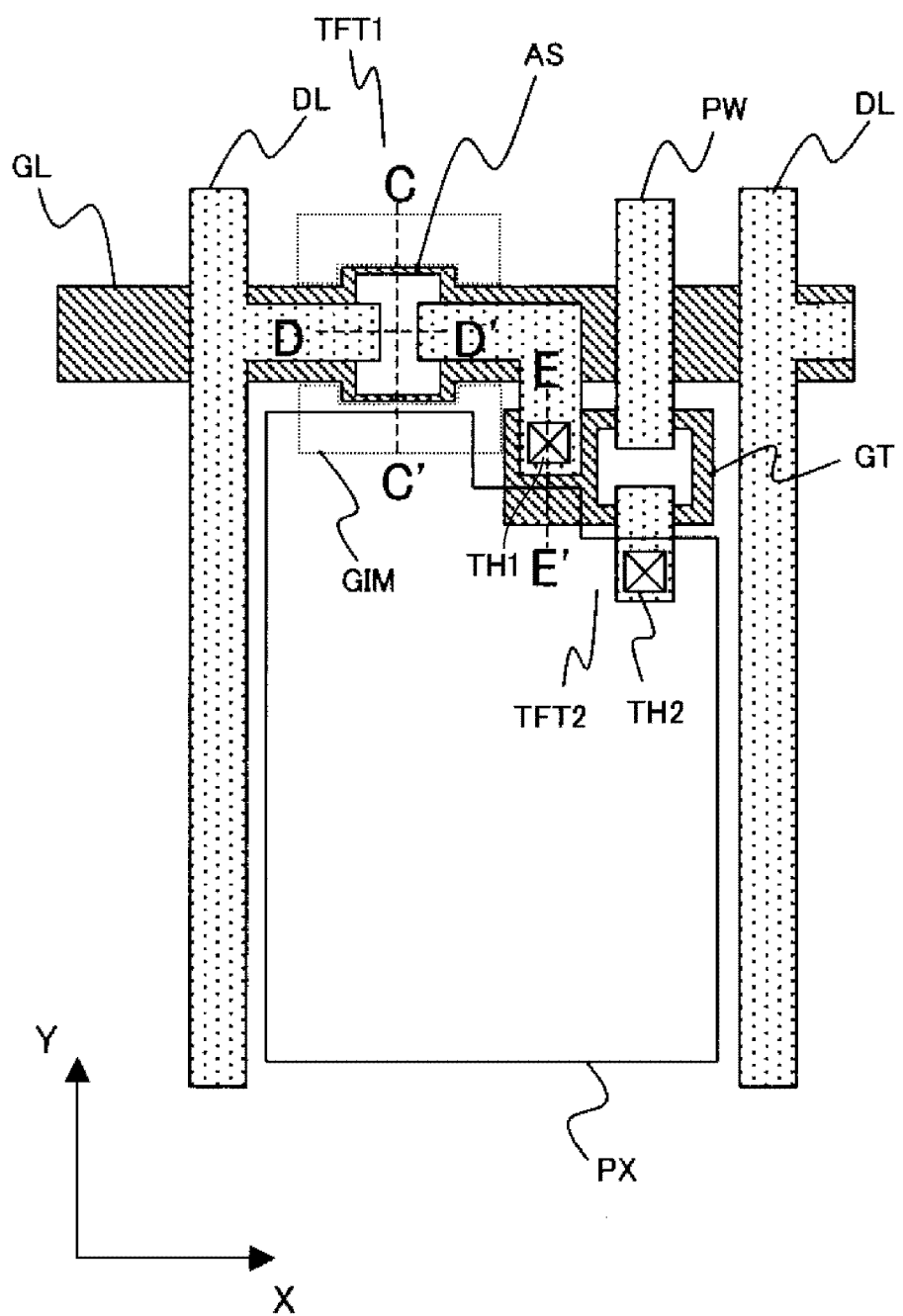
FIG. 24 is a view illustrating a pixel structure of the OLED display device, which is the image display device according to the fourth embodiment of the present invention.

FIG. 24 is a view illustrating a pixel structure of the OLED display device, which is the image display device according to the fourth embodiment of the present invention. Note that, the structure of the first thin film transistor TFT1 illustrated in FIG. 24 is the same as that of the thin film transistor TFT of the first embodiment described above. Therefore, the cross-sectional views taken along the line C-C', the line D-D', and the line E-E' of FIG. 24 are the cross-sectional views illustrated in FIG. 4. Hereinafter, with reference to FIG. 24 and FIG. 4, the pixel structure of the OLED display device of the fourth embodiment is described in detail.

As illustrated in FIG. 24, also in the OLED display device of the fourth embodiment, independent pixel electrodes PX are respectively formed in regions each surrounded by a pair of adjacent drain lines DL and a pair of adjacent gate lines GL, to thereby form a region for pixel including the light emission layer OLED (not shown). The semiconductor layer AS made of, for example, amorphous silicon is formed so as to overlap a part of the gate line GL. Note that, the material of the semiconductor layer AS is not limited to amorphous silicon, and may be low-temperature polysilicon, microcrystalline silicon, or the like. Further, the drain line DL extending in the Y direction of FIG. 24 has a part corresponding to an extension portion, which extends to the first thin film transistor TFT1 side. This extension portion is connected to the drain electrode DT of the first thin film transistor TFT1, which is formed on the semiconductor layer AS. Further, the source electrode ST, which is simultaneously formed with the formation of the drain line DL and the drain electrode DT, is formed so as to be opposed to the drain electrode DT on the semiconductor layer AS, the source electrode ST having an extension portion extending to the second thin film transistor TFT2 side from on the semiconductor layer AS. This extension portion is electrically connected to a gate electrode of the second thin film transistor TFT2 via a contact hole TH1.

The gate electrode GT of the second thin film transistor TFT2 has a part overlapping the pixel electrode PX through intermediation of an insulating film (not shown), and in this overlapping region, the storage capacitor Cst provided in parallel between the drain-gate terminals of the second thin film transistor TFT2 is formed. Further, the power supply line PW extending in the Y direction of FIG. 24 has a part corresponding to an extension portion, which extends to the second thin film transistor TFT2 side, and this extension portion is connected to the source electrode ST of the second thin film transistor TFT2 formed on the semiconductor layer AS. The drain electrode DT of the second thin film transistor TFT2 provided opposed to the source electrode ST thereof on the semiconductor layer AS is connected via a contact hole TH2 to the pixel electrode PX, which is formed in an upper layer of the insulating film (not shown) and made of a known transparent electrode material such as ITO.

Also in the first thin film transistor TFT1 of the fourth embodiment, the removal regions GIM of the insulating film are formed in regions indicated by the dotted lines, which are regions in which the insulating film to be formed between the gate electrode GT and the semiconductor layer AS is not formed. The removal regions GIM of the insulating film are formed so as to sandwich the semiconductor layer AS and the gate line GL. That is, the removal regions GIM of the insulating film sandwich the gate line GL in the region where the semiconductor layer AS is formed from upper and lower sides of FIG. 24. In this case, the removal regions GIM of the fourth embodiment are formed so that the gate electrode is formed along, out of side edge portions of the removal regions GIM, side edge portions of the removal regions GIM on opposing sides, that is, sides on which the gate electrode is formed. With this structure, the protrusion amount of the gate electrode in the Y direction may be equivalent to the protrusion amount of the semiconductor layer AS. Further, an interval between the gate line GL and the pixel electrode PX which is disposed adjacent to the gate line GL may be formed smaller than that of the conventional thin film transistor. As a result, it is possible to increase the area to be occupied by the pixel electrode PX within the pixel region, which is a limited region surrounded by the drain lines DL and the gate lines GL. Therefore, it is possible to improve the aperture ratio of the pixel while reducing the leakage current of the first thin film transistor TFT1.

Figure 25:
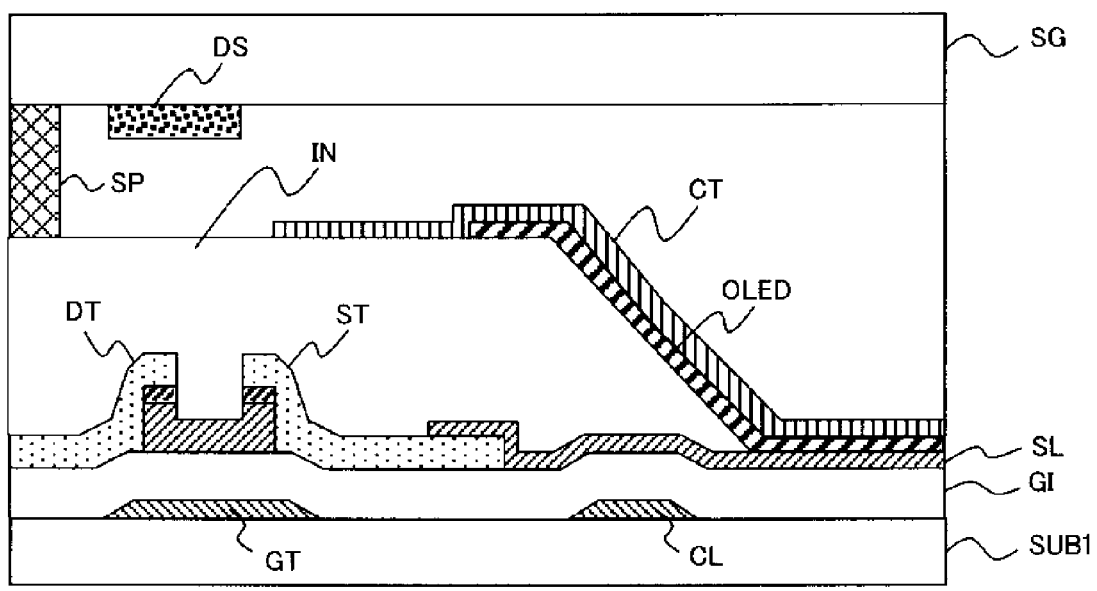
FIG. 25 is a cross-sectional view illustrating a schematic structure of the OLED display device, which is the image display device according to the fourth embodiment of the present invention.

FIG. 25 is a cross-sectional view illustrating a schematic structure of the OLED display device, which is the image display device according to the fourth embodiment of the present invention. Note that, the thin film transistor illustrated in FIG. 25 is the second thin film transistor TFT2 for drive, which controls a current amount supplied to the light emission layer OLED.

As illustrated in FIG. 25, in the OLED display device of the fourth embodiment, a pixel is formed in a region between the first substrate SUB1 and the sealing glass SG, and a predetermined interval is maintained by a spacer SP. Further, because a light emission material used in the light emission layer OLED has a property of being very susceptible to humidity, in the fourth embodiment, a known desiccant DS is disposed on the sealing glass SG on the inner side, that is, on the pixel formation side. Further, on the upper surface side (pixel formation side) of the first substrate SUB1, the gate electrode GT and the gate line GL are formed, and the insulating film (gate insulating film) GI is formed in an upper layer of the gate electrode GT and the gate line GL. In an upper layer of the insulating film GI, the semiconductor layer AS in an island shape is formed. The contact layers CNT are formed so as to sandwich the recess portion formed in the semiconductor layer AS. The drain electrode DT and the source electrode ST are respectively laminated on the contact layers CNT. In this manner, the second thin film transistor TFT2 is formed. The extension portion extending from the source electrode ST of the second thin film transistor TFT2 is electrically connected to the pixel electrode PX, which is made of ITO being a transparent conductive material. In an upper layer of the pixel electrode PX, the light emission layer OLED including the organic EL film is formed. In an upper layer of the light emission layer OLED, the common electrode CT is formed, and is connected to the common line (not shown). Further, in an upper layer of the second thin film transistor TFT2 and in a region excluding the region where the pixel electrode PX is formed, the interlayer insulating film IN is formed.

As described above, the OLED display device of the fourth embodiment has a bottom emission type structure, in which light from the light emission layer OLED is taken out to the first substrate SUB1 side, and hence by reducing the size of the gate electrode GT, it is possible to improve the aperture ratio of the pixel and to obtain a high contrast OLED display device. This embodiment can obtain the same effect even when the thin film transistor of the second embodiment is applied.

Figure 26:
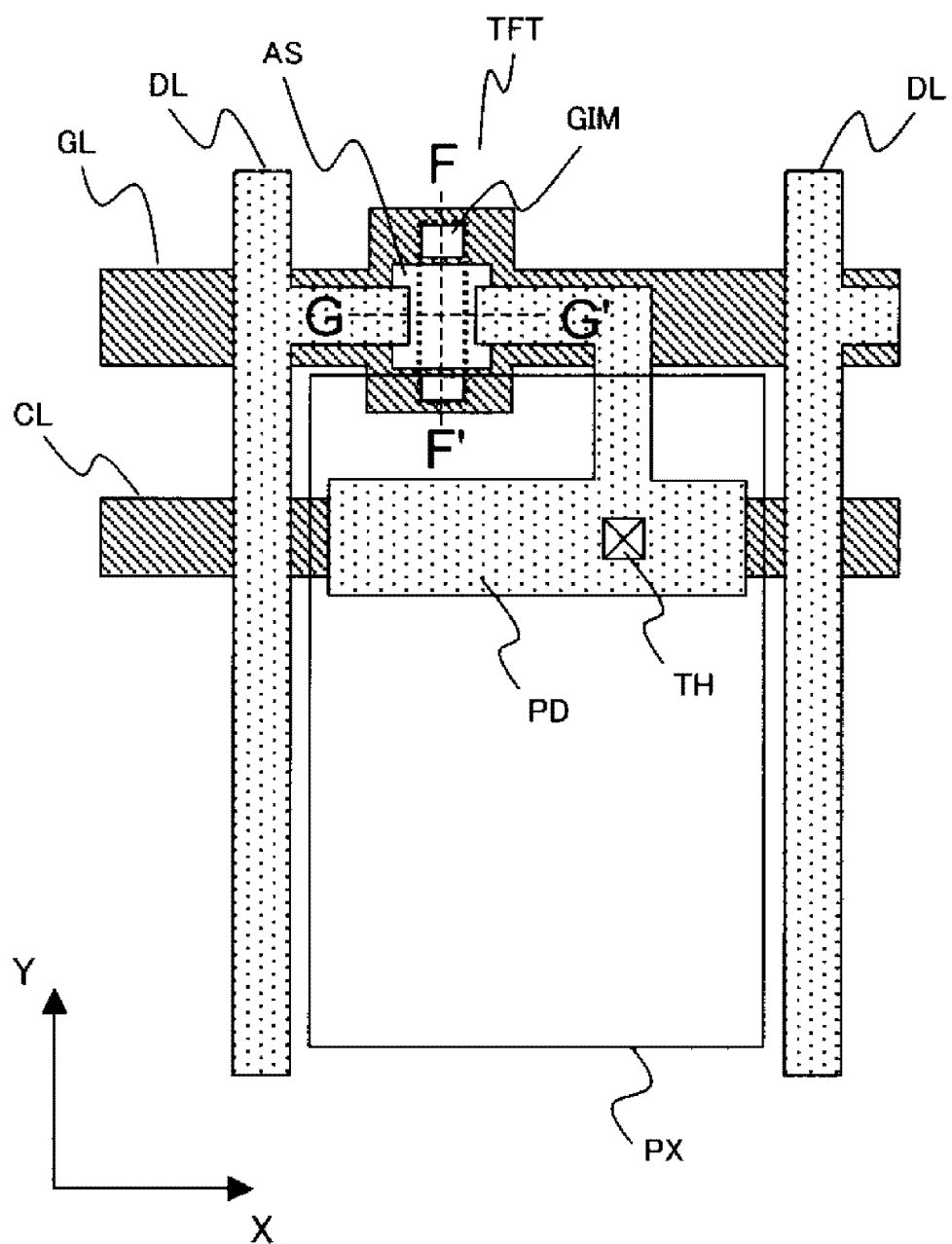
FIG. 26 is a plan view illustrating a schematic structure of a thin film transistor in an image display device according to another embodiment of the present invention.
Figure 27:
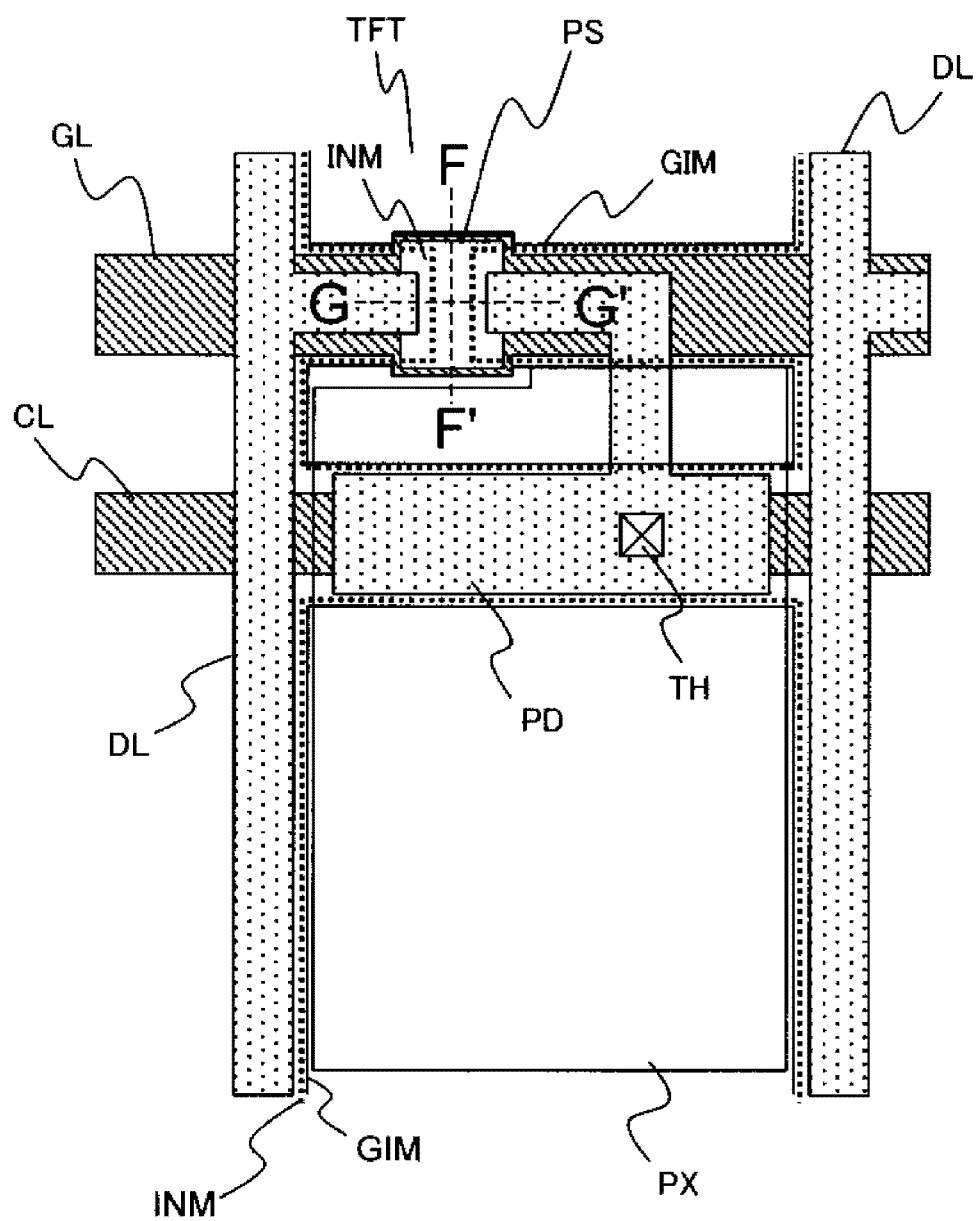
FIG. 27 is a plan view illustrating a schematic structure of a thin film transistor in an image display device according to further another embodiment of the present invention.
Figure 28:
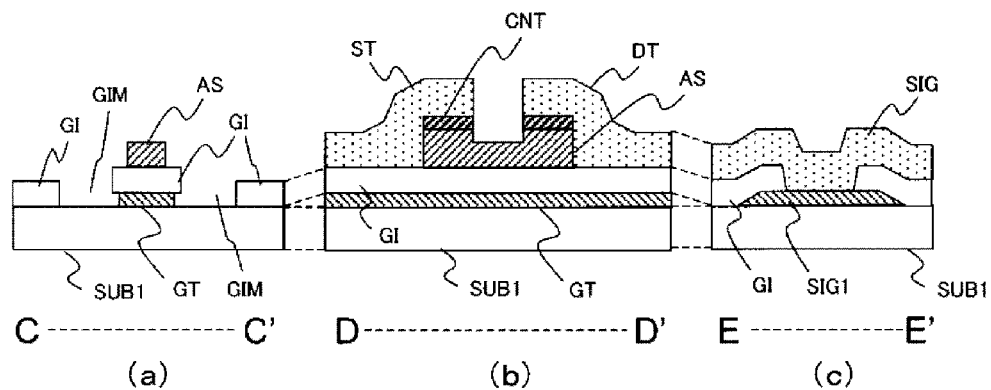
FIG. 28 is a view illustrating schematic structures of thin film transistors in an image display device according to still another embodiment of the present invention.
Figure 29:
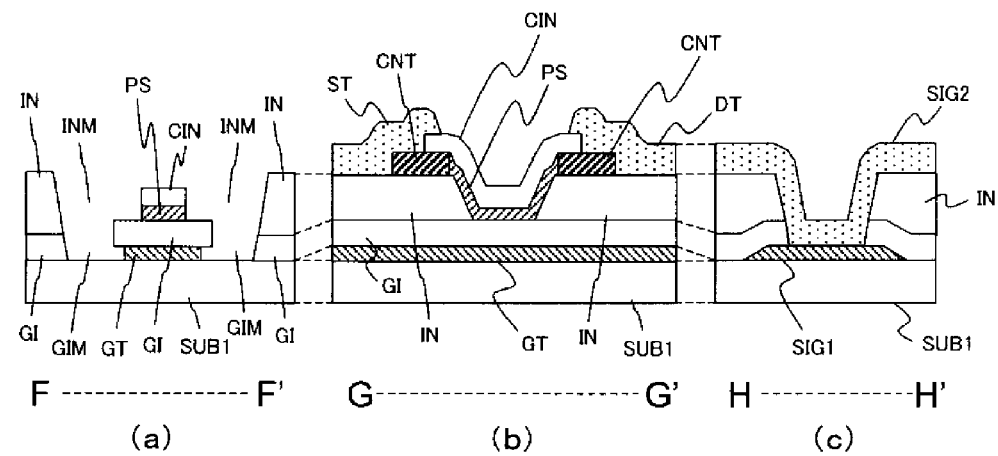
FIG. 29 is a view illustrating schematic structures of thin film transistors in an image display device according to still another embodiment of the present invention.

Note that, in the image display devices according to the first to fourth embodiments of the present invention, in the region where the thin film transistor is formed, the length of the removal region GIM of the insulating film (gate insulating film) GI in the channel length direction is formed larger than the formation region of the semiconductor layer AS or PS, but as illustrated in FIG. 26, the length of the removal region GIM in the channel length direction may be formed smaller than the formation region of the semiconductor layer AS or PS. Further, as illustrated in FIG. 27, the removal region GIM may be formed in the entire pixel region. In this case, the insulating film (gate insulating film) GI in the entire pixel region is removed, and hence it is possible to achieve a special effect that transmittance of the pixel can be improved and the contrast can be further improved.

Further, in the first to fourth embodiments, the material of each of the source electrode, the drain electrode, and the gate electrode GT may be a metal such as Ti, TiW, TiN, W, Cr, Mo, Ta, and Nb, or an alloy thereof.

In the above, there has been concretely described the invention made by the inventor with reference to the embodiments of the invention. However, the present invention is not limited to the embodiments of the invention, and various modifications are possible within the scope not departing from the spirit of the present invention.

What is claimed is:

1. An image display device, including a plurality of thin film transistors on a substrate, comprising:
   a plurality of gate lines formed on the substrate;
   a plurality of drain lines intersecting the plurality of gate lines formed on the substrate,
      each of the plurality of thin film transistors being of a bottom gate type and having, in a region overlapped by a channel region, a laminate structure in which a gate electrode, a gate insulating film, and a semiconductor layer are laminated in the stated order from the substrate side; and
   a pair of removal regions in which parts of the gate insulating film are removed, which are formed on both sides of the gate electrode in a channel width direction of the channel region,
   wherein when W represents a width of the gate electrode in the channel width direction of the channel region, and R represents a width of the gate insulating film in the channel width direction, which is sandwiched between the pair of removal regions, $R \leqq W$ is satisfied.

2. The image display device according to claim 1, wherein when H represents a width of the semiconductor layer in the channel width direction of the channel region, the width R of the gate insulating film in the channel width direction satisfies $R > H$.

3. The image display device according to claim 1, wherein when H represents a width of the semiconductor layer in the channel width direction of the channel region, the width W of the gate electrode in the channel width direction of the channel region satisfies $W > H$.

4. The image display device according to claim 2, wherein:
   each of the plurality of thin film transistors includes a source electrode and a drain electrode, which are formed in an upper layer of the semiconductor layer and formed of metal films; and
   the source electrode, the drain electrode, and the gate electrode are made of the same thin film material.

5. The image display device according to claim 2, wherein:
   each of the plurality of thin film transistors has, in each of regions overlapped by a source electrode and a drain electrode, a laminate structure in which the gate insulating film, an interlayer insulating film, a non-single-crystalline silicon film, and a metal film are laminated in the stated order from the substrate side;
   the semiconductor layer is formed in contact to each of the gate insulating film, the interlayer insulating film, and the non-single-crystalline silicon film;
   a part of the interlayer insulating film formed on an upper portion of the gate electrode is processed in a tapered shape; and
   the source electrode, the drain electrode, and the gate electrode are made of the same thin film material.

* * * * *